(12) United States Patent
Lee et al.

(10) Patent No.: US 11,682,675 B2
(45) Date of Patent: Jun. 20, 2023

(54) FIN FIELD-EFFECT TRANSISTOR DEVICE AND METHOD

(71) Applicant: Taiwan Semiconductor Manufacturing Co., Ltd., Hsinchu (TW)

(72) Inventors: Kai-Hsuan Lee, Hsinchu (TW); Sai-Hooi Yeong, Zhubei (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/326,043

(22) Filed: May 20, 2021

(65) Prior Publication Data

US 2022/0320094 A1  Oct. 6, 2022

Related U.S. Application Data

(60) Provisional application No. 63/168,047, filed on Mar. 30, 2021.

(51) Int. Cl.
*H01L 21/8234* (2006.01)
*H01L 21/768* (2006.01)
(Continued)

(52) U.S. Cl.
CPC ...... *H01L 27/0924* (2013.01); *H01L 21/7682* (2013.01); *H01L 21/76829* (2013.01);
(Continued)

(58) Field of Classification Search
CPC ..... H01L 21/823431; H01L 21/823475; H01L 21/7682; H01L 21/76829–76834;
(Continued)

(56) References Cited

U.S. PATENT DOCUMENTS

| 9,105,490 B2 | 8/2015 | Wang et al. |
| 9,236,267 B2 | 1/2016 | De et al. |

(Continued)

FOREIGN PATENT DOCUMENTS

| JP | 2009194228 A | 8/2009 |
| WO | 2018182619 A1 | 10/2018 |

*Primary Examiner* — Errol V Fernandes
*Assistant Examiner* — Jeremy J Joy
(74) *Attorney, Agent, or Firm* — Slater Matsil, LLP

(57) ABSTRACT

A method of forming a semiconductor device includes: forming a gate structure over a fin that protrudes above a substrate, the gate structure being surrounded by a first interlayer dielectric (ILD) layer; forming a trench in the first ILD layer adjacent to the fin; filling the trench with a first dummy material; forming a second ILD layer over the first ILD layer and the first dummy material; forming an opening in the first ILD layer and the second ILD layer, the opening exposing a sidewall of the first dummy material; lining sidewalls of the opening with a second dummy material; after the lining, forming a conductive material in the opening; after forming the conductive material, removing the first and the second dummy materials from the trench and the opening, respectively; and after the removing, sealing the opening and the trench by forming a dielectric layer over the second ILD layer.

20 Claims, 35 Drawing Sheets

(51) Int. Cl.
*H01L 27/092* (2006.01)
*H01L 29/417* (2006.01)
*H01L 29/66* (2006.01)
*H01L 29/78* (2006.01)

(52) U.S. Cl.
CPC ............ *H01L 21/76843* (2013.01); *H01L 21/823431* (2013.01); *H01L 21/823475* (2013.01); *H01L 29/41791* (2013.01); *H01L 29/66795* (2013.01); *H01L 29/7851* (2013.01)

(58) Field of Classification Search
CPC ....... H01L 21/76841–76846; H01L 21/76865; H01L 29/66795; H01L 29/785–7851; H01L 29/41791; H01L 27/0886; H01L 27/1211
See application file for complete search history.

(56) References Cited

U.S. PATENT DOCUMENTS

| | | | |
|---|---|---|---|
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 * | 1/2017 | Ho | H01L 29/6656 |
| 9,576,814 B2 | 2/2017 | Wu et al. | |
| 9,831,183 B2 | 11/2017 | Lin et al. | |
| 9,859,386 B2 | 1/2018 | Ho et al. | |
| 9,991,167 B2 * | 6/2018 | Kumar | H01L 27/088 |
| 10,971,588 B2 * | 4/2021 | Huang | H01L 21/76897 |
| 11,107,902 B2 * | 8/2021 | Chen | H01L 21/76224 |
| 2010/0237424 A1 * | 9/2010 | Cheng | H01L 21/823878 257/E29.345 |
| 2011/0062587 A1 | 3/2011 | Yang et al. | |
| 2015/0243544 A1 * | 8/2015 | Alptekin | H01L 21/7682 438/586 |
| 2015/0318178 A1 | 11/2015 | Pham et al. | |
| 2015/0325482 A1 * | 11/2015 | Hu | H01L 21/31111 438/585 |
| 2016/0043197 A1 * | 2/2016 | Kim | H01L 21/31116 438/283 |
| 2017/0309715 A1 * | 10/2017 | Huang | H01L 21/823431 |
| 2018/0197970 A1 * | 7/2018 | Pan | H01L 29/7851 |
| 2018/0315618 A1 * | 11/2018 | Huang | H01L 21/823431 |
| 2019/0043959 A1 * | 2/2019 | Lee | H01L 29/6656 |
| 2019/0164829 A1 * | 5/2019 | Yang | H01L 29/7851 |
| 2019/0165172 A1 * | 5/2019 | Joshi | H01L 28/20 |
| 2019/0393324 A1 * | 12/2019 | Chen | H01L 21/76897 |
| 2020/0105867 A1 * | 4/2020 | Lee | H01L 21/823864 |
| 2020/0161439 A1 * | 5/2020 | You | H01L 29/41791 |
| 2020/0411415 A1 * | 12/2020 | Wu | H01L 23/4821 |
| 2021/0050412 A1 | 2/2021 | Wong et al. | |
| 2021/0066500 A1 * | 3/2021 | Liu | H01L 21/823807 |
| 2021/0090959 A1 * | 3/2021 | Min | H01L 21/7682 |

* cited by examiner

FIN FIELD-EFFECT TRANSISTOR DEVICE AND METHOD

PRIORITY CLAIM AND CROSS-REFERENCE

This application claims priority to U.S. Provisional Patent Application No. 63/168,047, filed Mar. 30, 2021, entitled "Dramatic Parasitic Capacitance Reduction Using Air Moat," which application is hereby incorporated by reference in its entirety

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
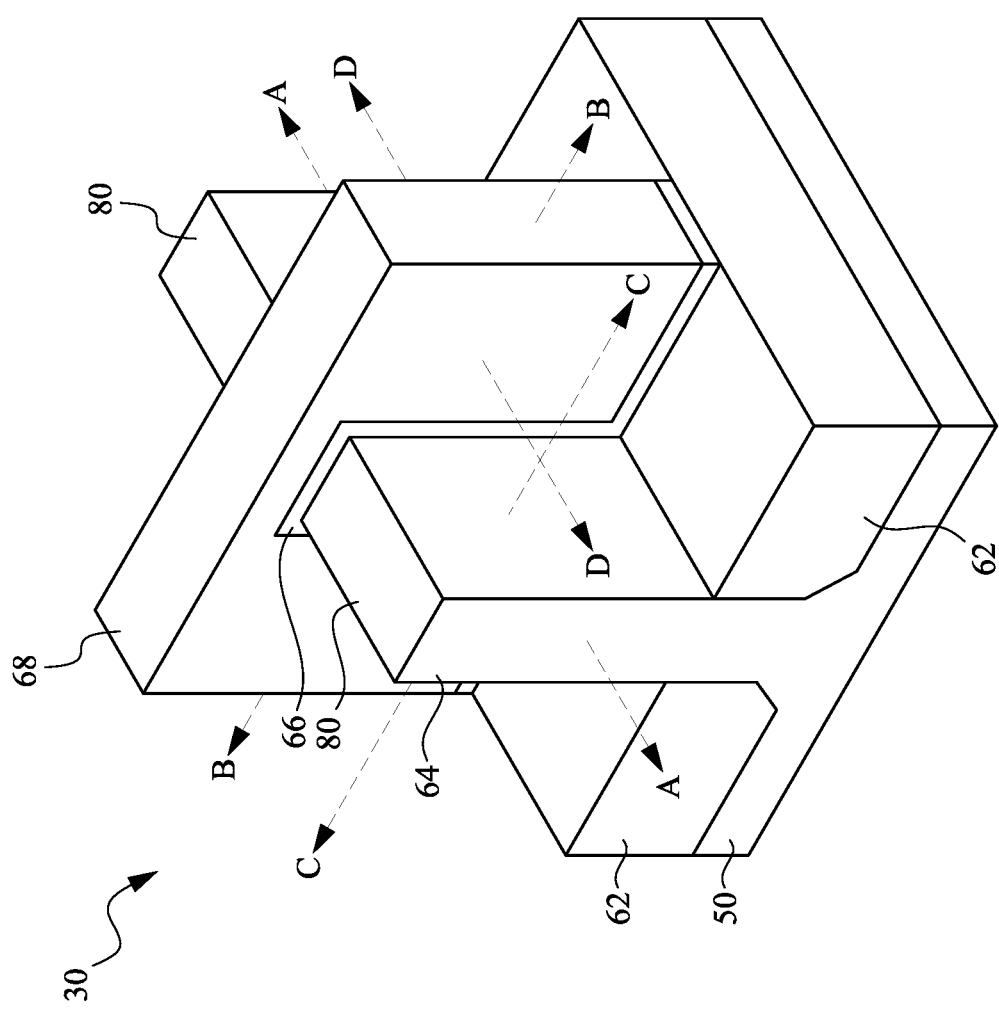
FIG. 1 is a perspective view of a Fin Field-Effect Transistor (FinFET), in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar reference numeral in different figures refers to the same or similar element formed by a same or similar formation method using a same or similar material(s). In addition, figures with the same reference numeral but different letters (e.g., FIGS. 9A-9D) illustrate different views of the same semiconductor device at the same stage of manufacturing.

Embodiments of the present disclosure are discussed in the context of forming a semiconductor device, and in particular, in the context of forming air moats (e.g., air gaps) around vias and/or forming air gaps in the dielectric layer of a Fin Field-Effect Transistor (FinFET) device. The principle of the disclosure may also be applied to other types of devices, such as planar devices.

In accordance with an embodiment of the present disclosure, a gate structure is formed over a fin, and an interlayer dielectric (ILD) layer is formed around the gate structure. Air gaps are formed around source/drain contacts in the ILD layer, and/or are formed in the ILD layer adjacent to the fin. The air gaps help to reduce the parasitic capacitance of the device formed, thereby improving the device performance.

FIG. 1 illustrates an example of a FinFET 30 in a perspective view. The FinFET 30 includes a substrate 50 and a fin 64 protruding above the substrate 50. Isolation regions 62 are formed on opposing sides of the fin 64, with the fin 64 protruding above the isolation regions 62. A gate dielectric 66 is along sidewalls and over a top surface of the fin 64, and a gate electrode 68 is over the gate dielectric 66. Source/drain regions 80 are in the fin 64 and on opposing sides of the gate dielectric 66 and the gate electrode 68. FIG. 1 further illustrates reference cross-sections that are used in later figures. Cross-section B-B extends along a longitudinal axis of the gate electrode 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section B-B and is across the source/drain region 80. Cross-section D-D is parallel to cross-section A-A and is outside the fin 64 (e.g., between two adjacent fins 64). Subsequent figures refer to these reference cross-sections for clarity.

Figure 6:
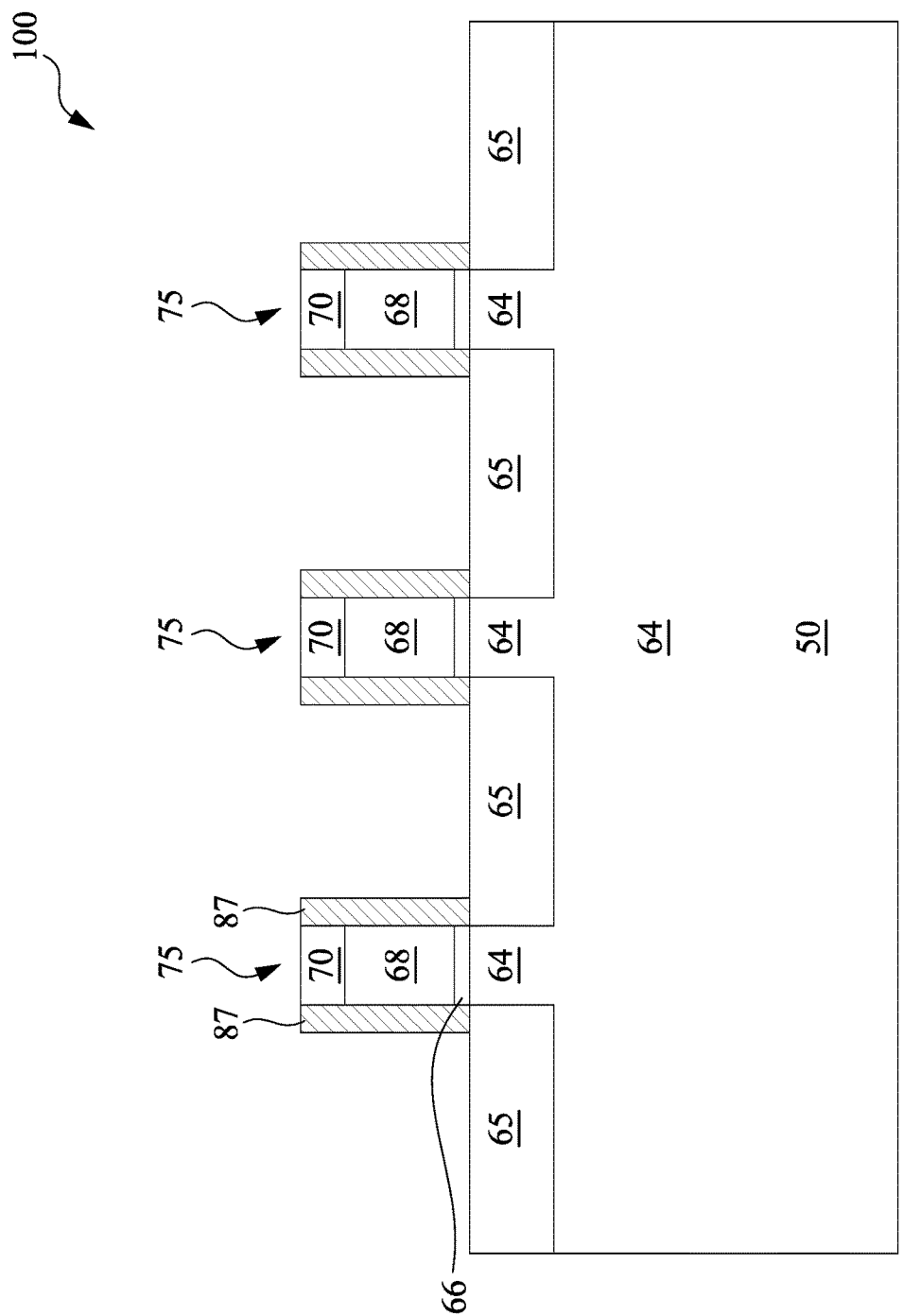
Figure 7:
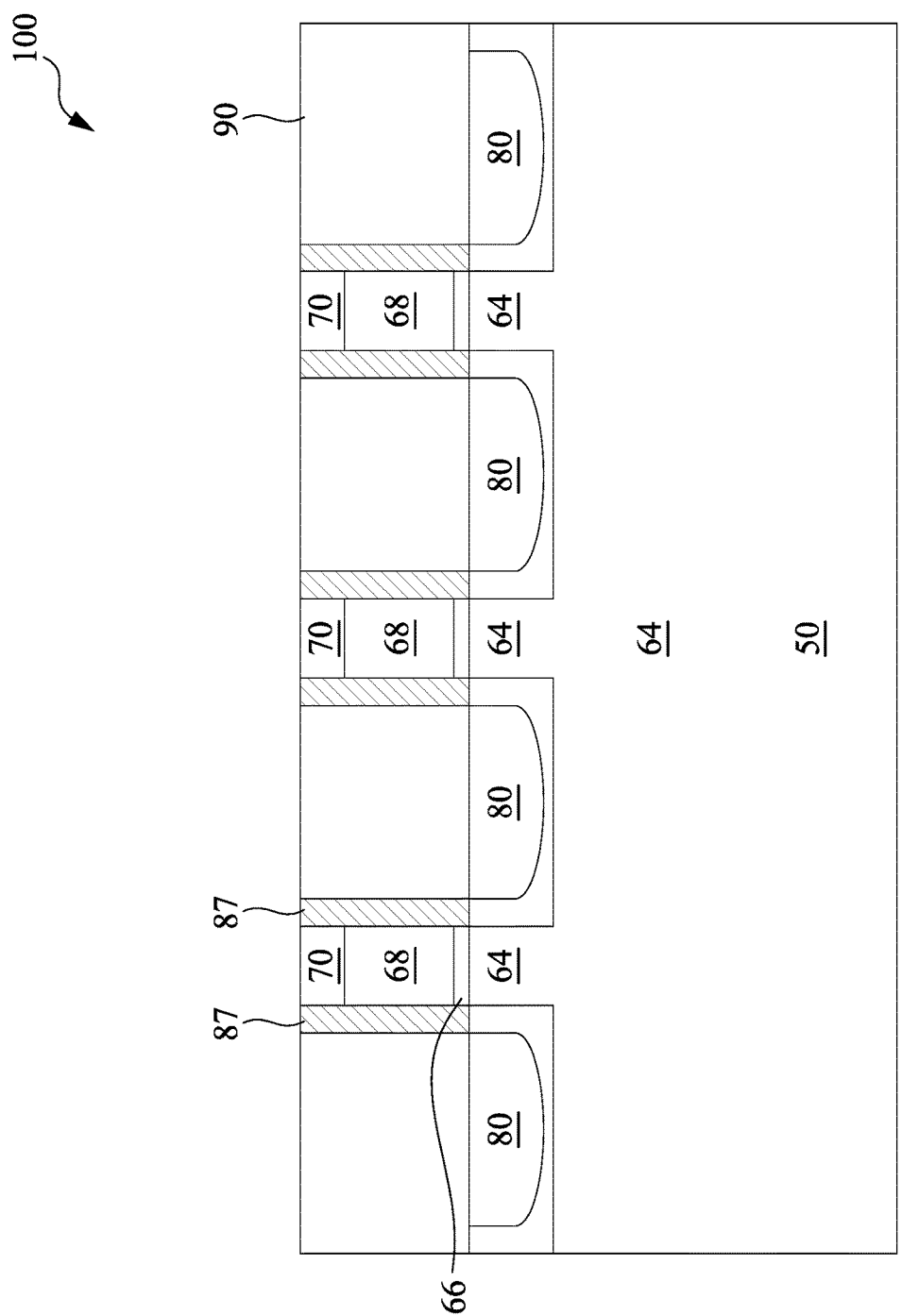
Figure 8A:
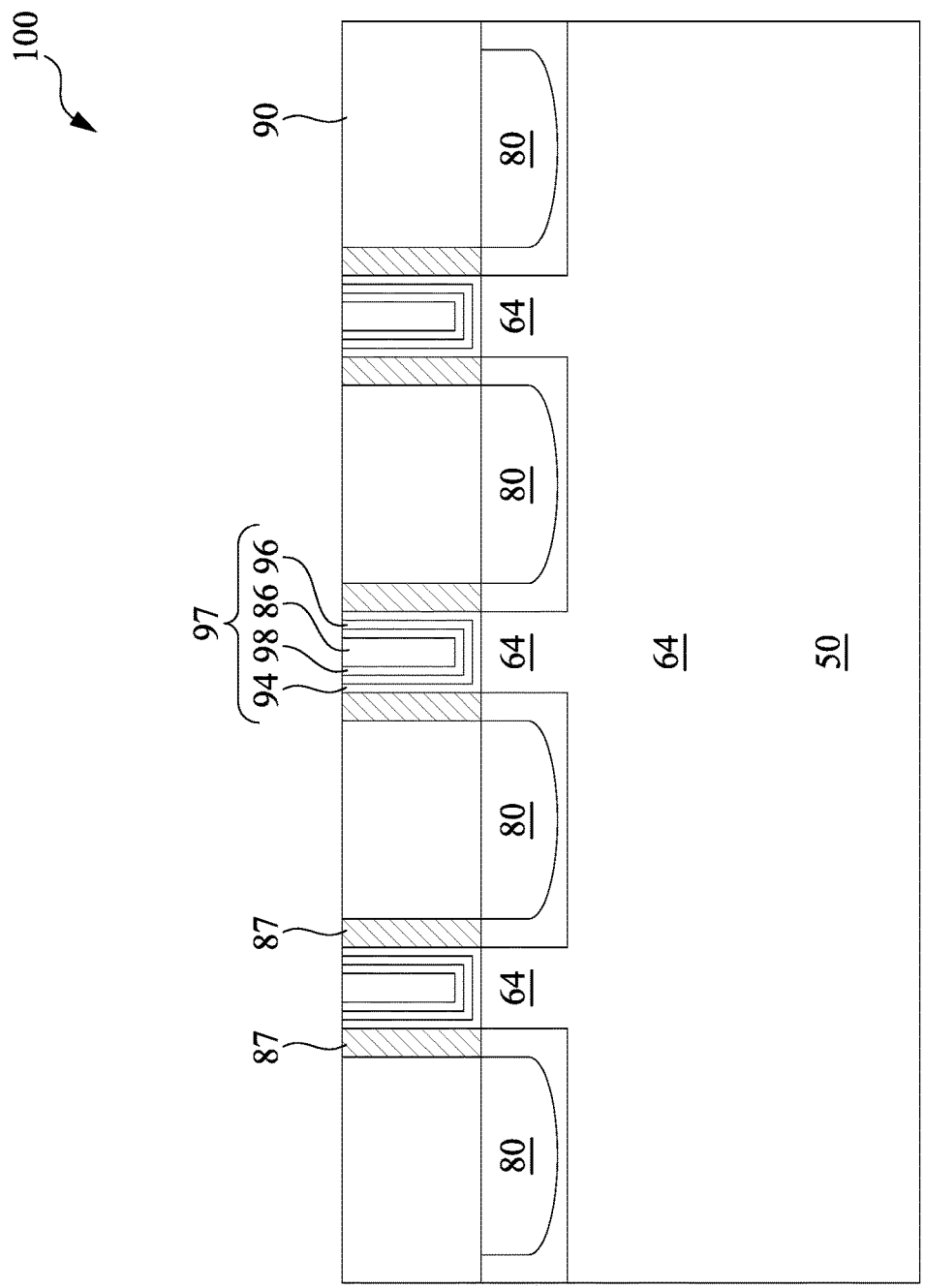
Figure 8B:
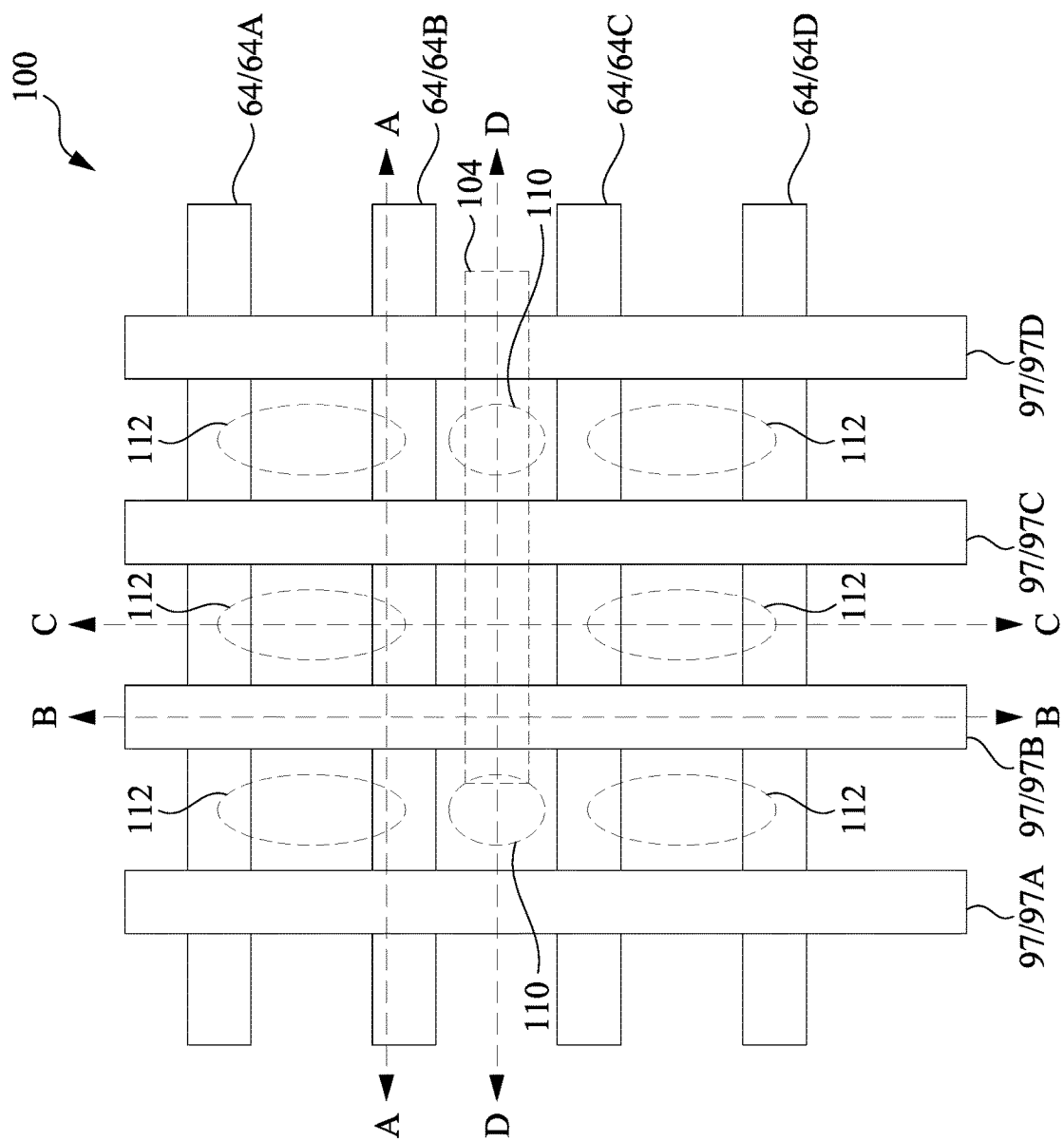
Figure 9A:
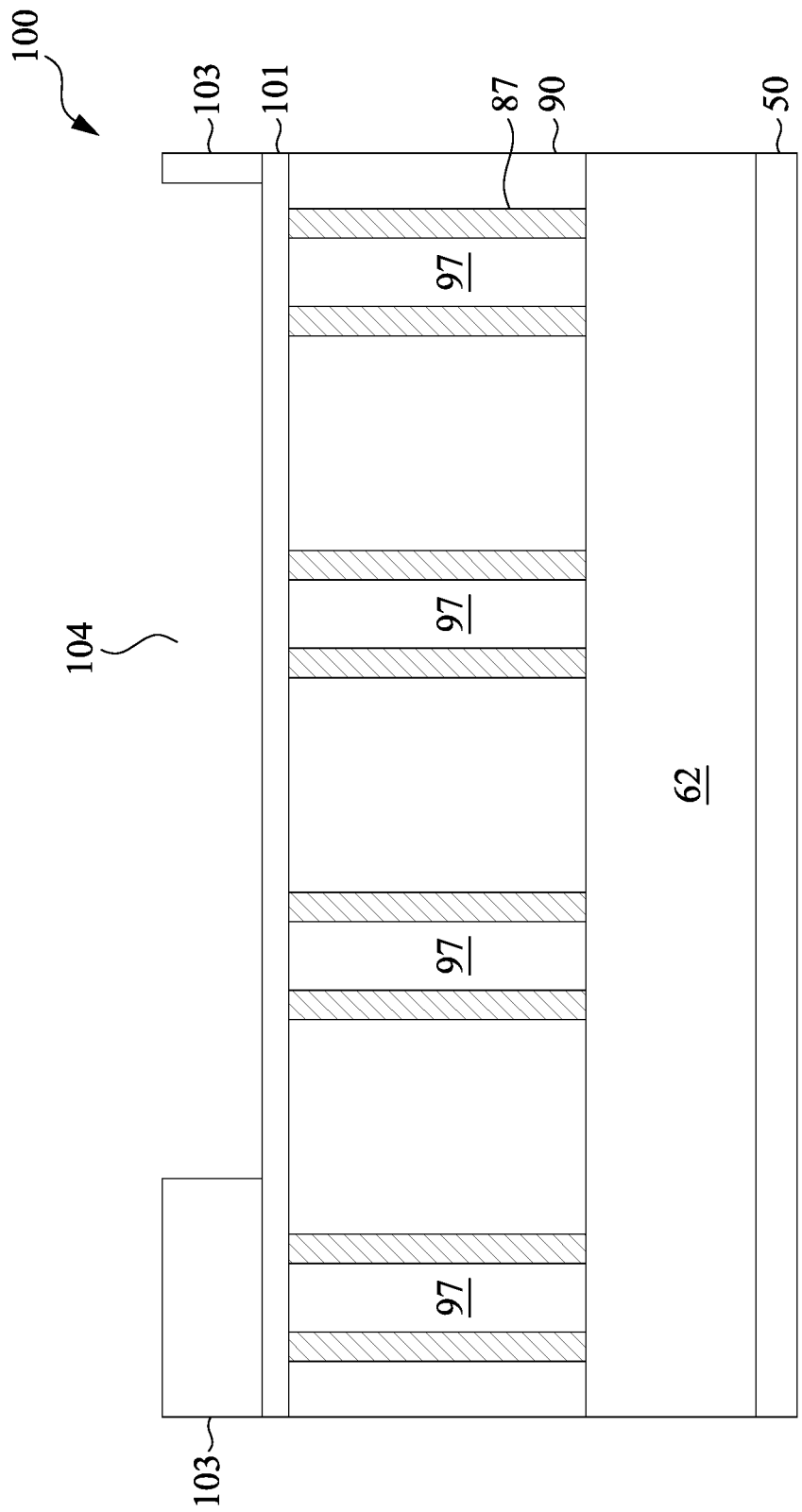
Figure 9B:
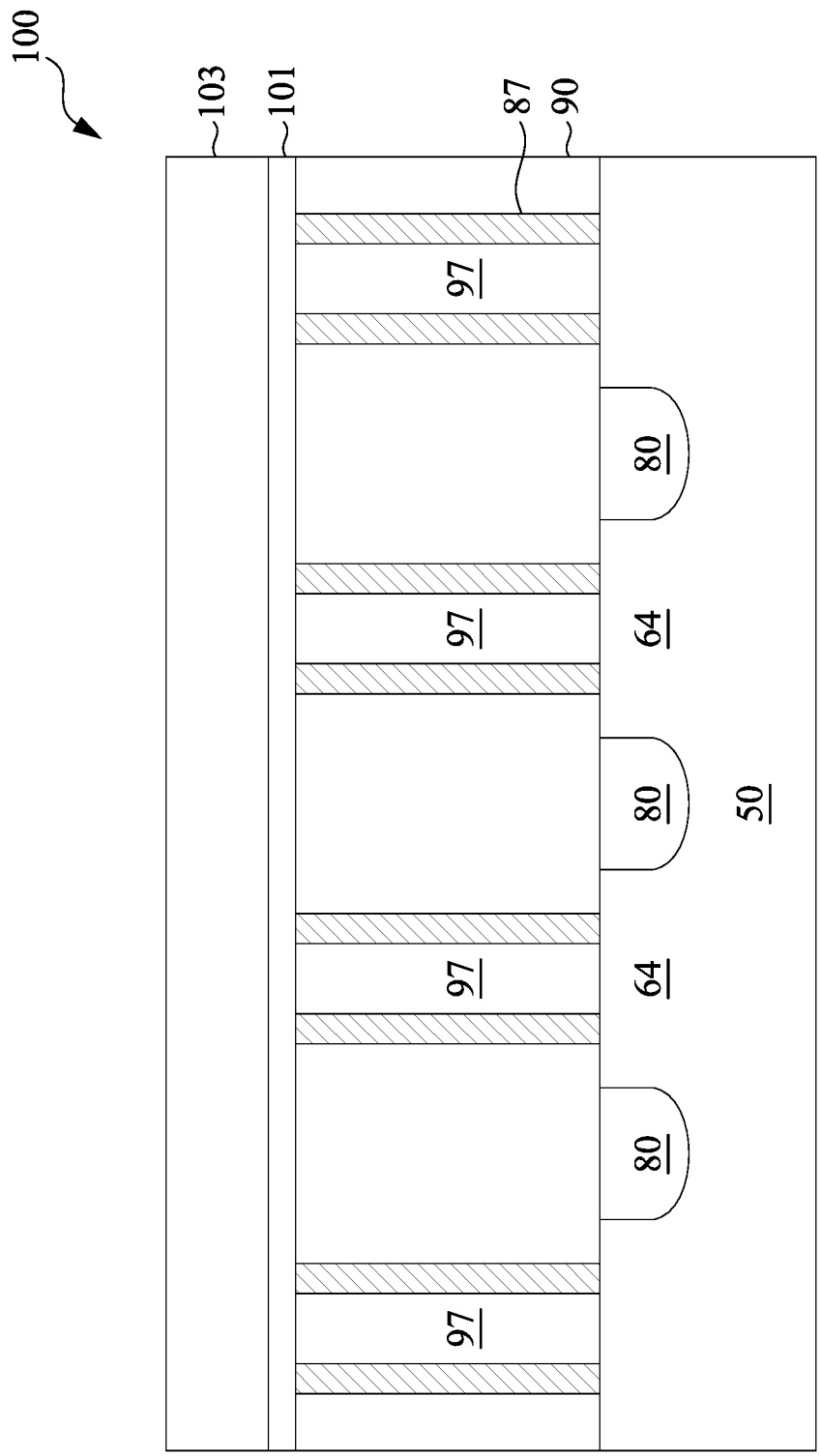
Figure 9D:
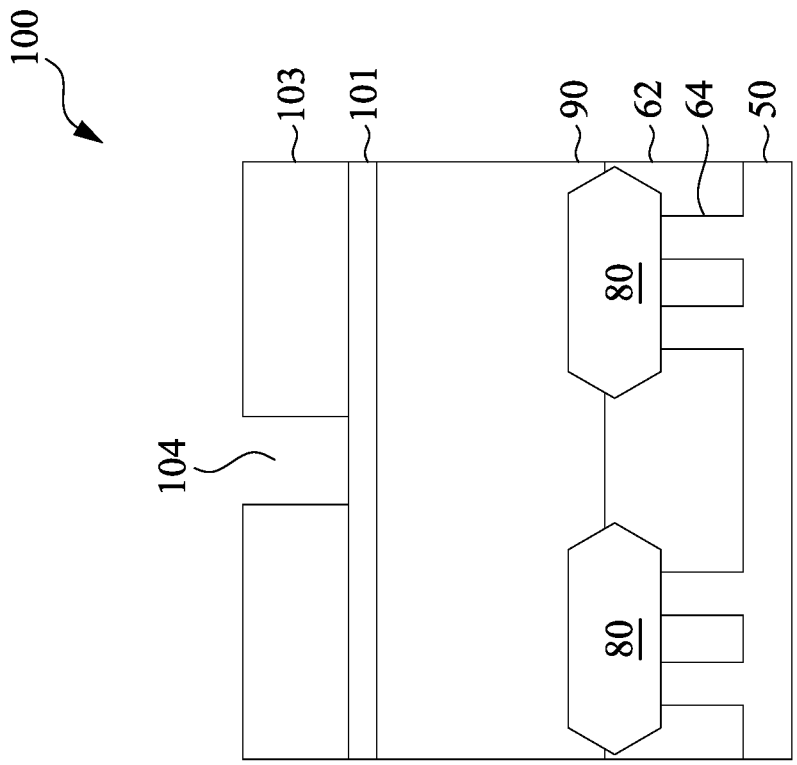
Figure 9C:
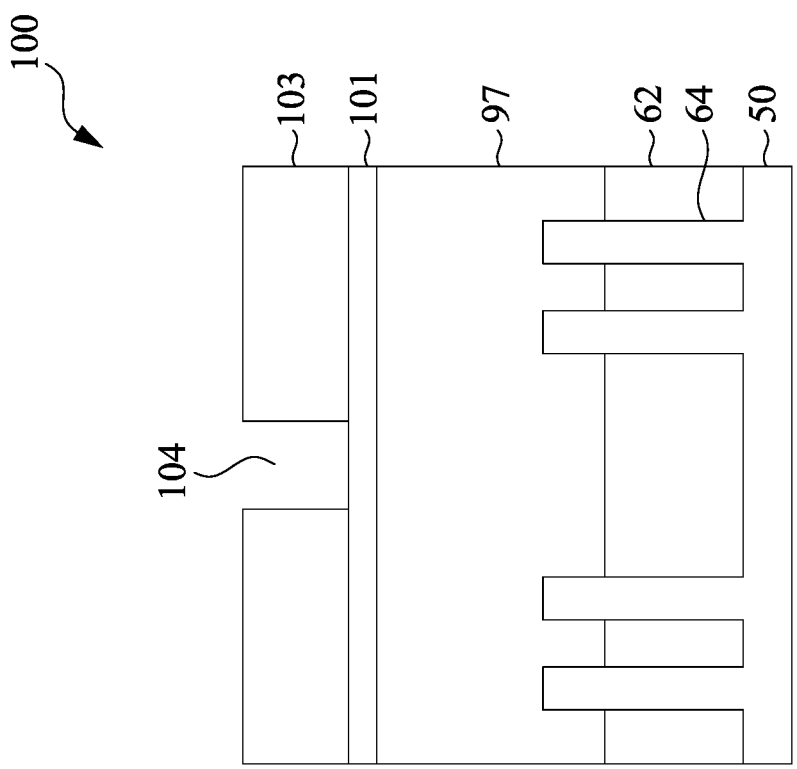
Figure 10A:
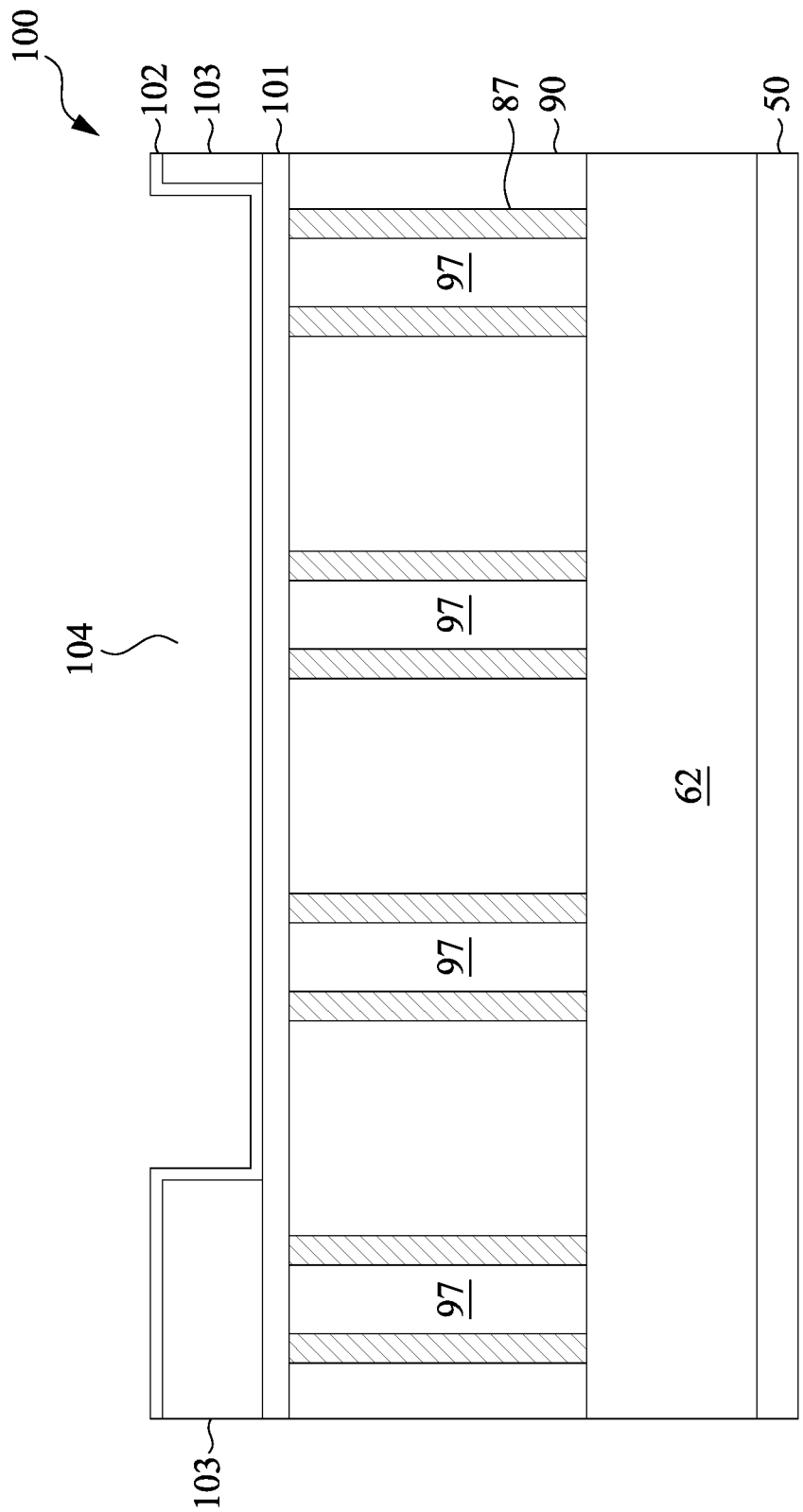
Figure 10B:
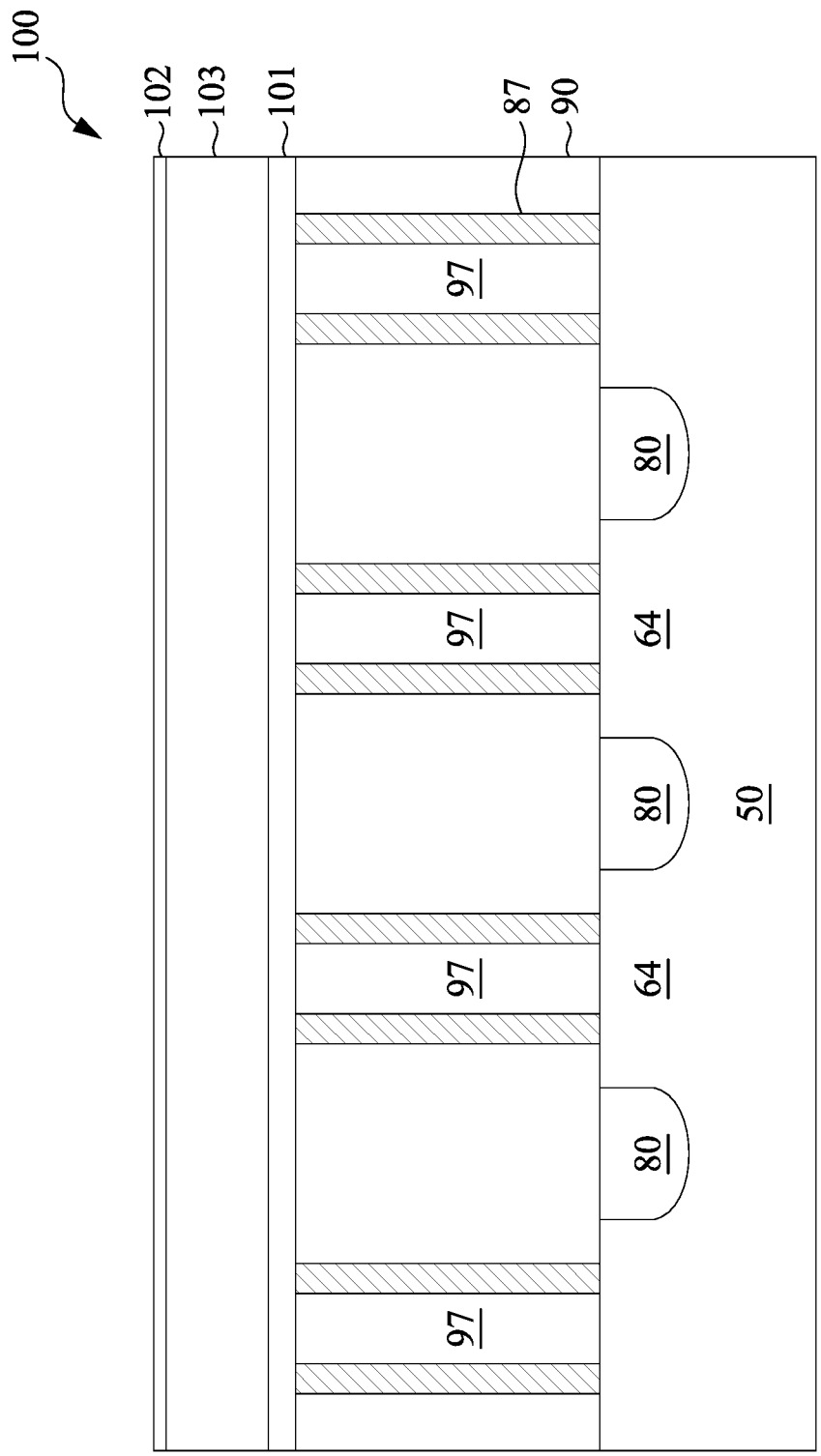
Figure 10D:
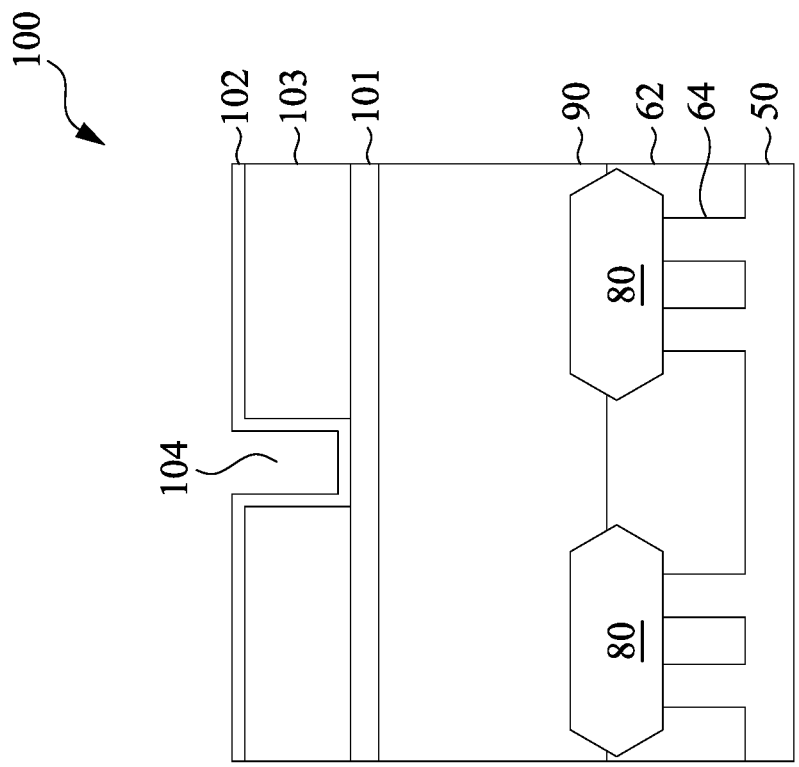
Figure 10C:
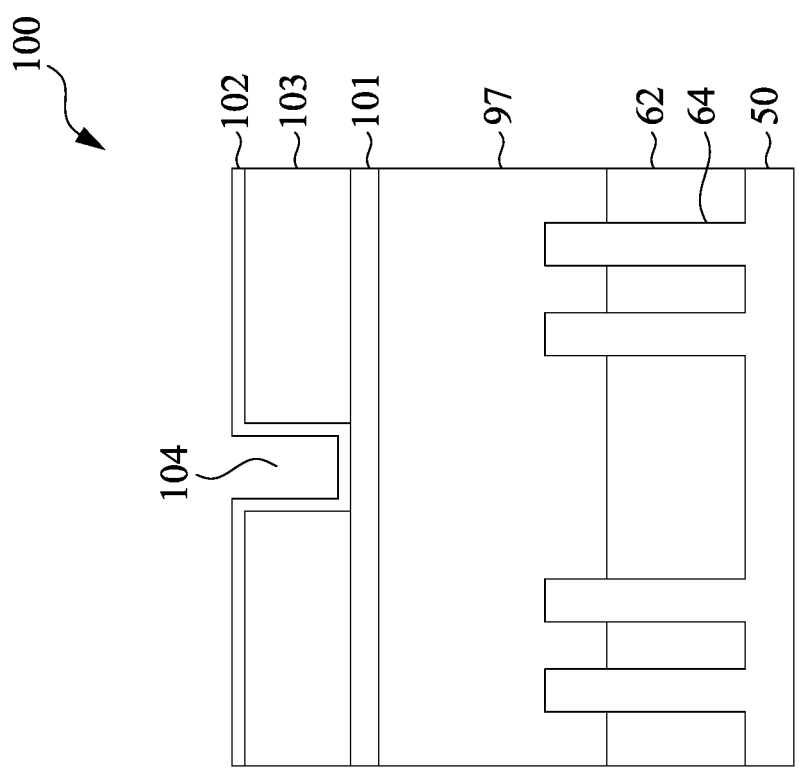

FIGS. 2-7, 8A, 8B, 9A-9D, 10A-10D, 11A-11D, 12A-12D, 13A-13D, 14A-14D, 15A-15D, and 16A-16D illustrate various views (e.g., cross-sectional view, top view) of a FinFET device 100 at various stages of fabrication, in accordance with an embodiment. The FinFET device 100 is similar to the FinFET 30 in FIG. 1, except for multiple fins and multiple gate structures. FIGS. 2-5 illustrate cross-sectional views of the FinFET device 100 along cross-section B-B, and FIGS. 6, 7, and 8A illustrate cross-sectional views of the FinFET device 100 along cross-section A-A. FIG. 8B illustrates a plan view of the FinFET device 100. For FIGS. 9A-9D, 10A-10D, 11A-11D, 12A-12D, 13A-

13D, 14A-14D, 15A-15D, and 16A-16D, figures with the letters A (e.g., FIG. 9A), B (e.g., FIG. 9B), C (e.g., FIG. 9C) and D (e.g., FIG. 9D) illustrate cross-sectional views of the FinFET device 100 along cross-sections D-D, A-A, B-B, and C-C, respectively.

Figure 2:
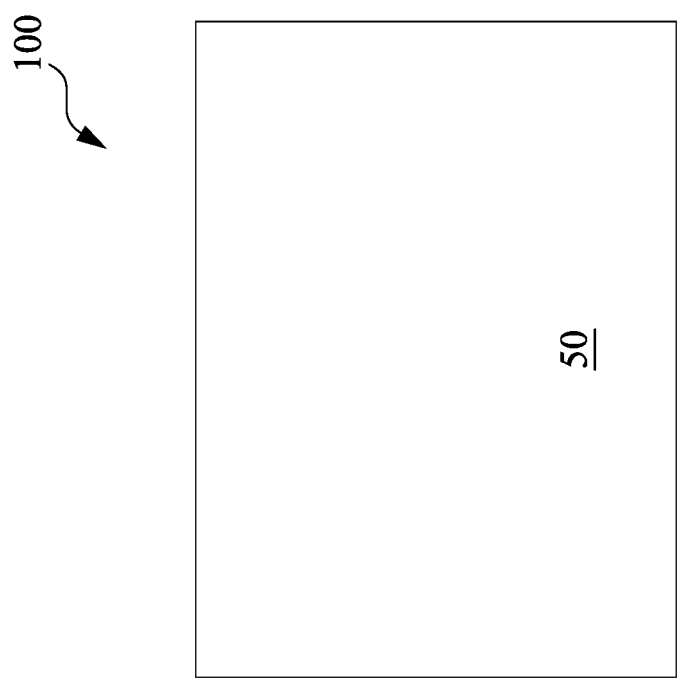

FIG. 2 illustrates a cross-sectional view of a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
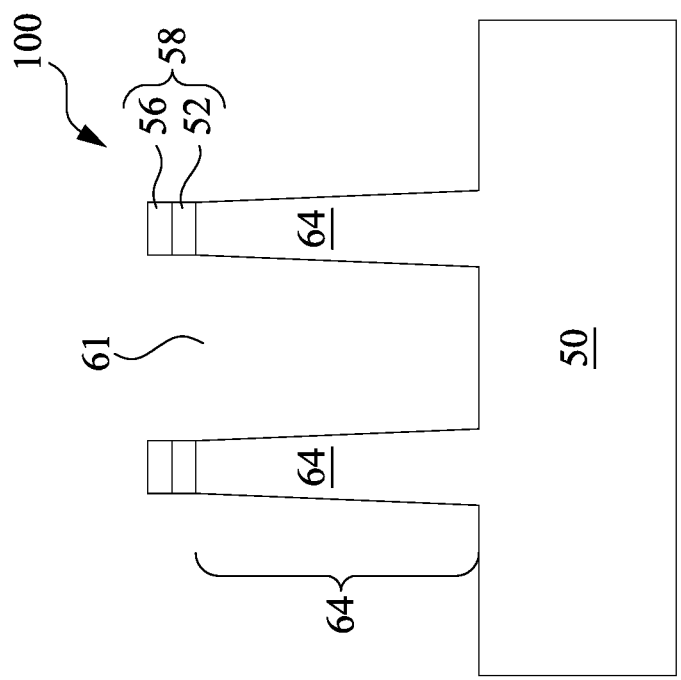
FIGS. 2-7, 8A, 8B, 9A-9D, 10A-10D, 11A-11D, 12A-12D, 13A-13D, 14A-14D, 15A-15D, and 16A-16D illustrate various views of a FinFET device at various stages of fabrication, in accordance with an embodiment.

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56 and may act as an etch stop layer for etching the pad nitride layer 56. In some embodiments, the pad nitride layer 56 is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58, as illustrated in FIG. 3.

The patterned mask 58 is subsequently used to pattern exposed portions of the substrate 50 to form trenches 61, thereby defining semiconductor fins 64 between adjacent trenches 61 as illustrated in FIG. 3. In some embodiments, the semiconductor fins 64 are formed by etching trenches in the substrate 50 using, for example, reactive ion etch (RIE), neutral beam etch (NBE), the like, or a combination thereof. The etch may be anisotropic. In some embodiments, the trenches 61 may be strips (viewed from in the top) parallel to each other, and closely spaced with respect to each other. In some embodiments, the trenches 61 may be continuous and surround the semiconductor fins 64. The semiconductor fins 64 may also be referred to as fins 64 hereinafter.

The fins 64 may be patterned by any suitable method. For example, the fins 64 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
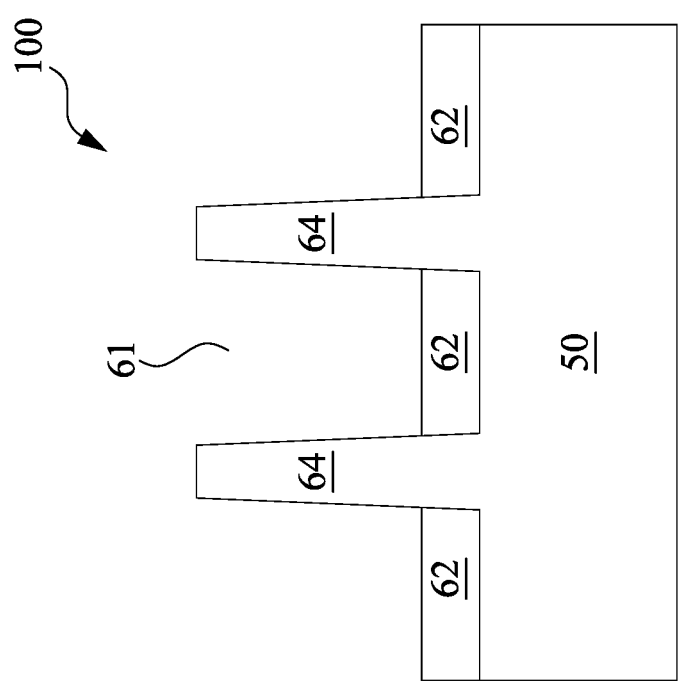

FIG. 4 illustrates the formation of an insulation material between neighboring semiconductor fins 64 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 62 and top surfaces of the semiconductor fins 64 that are coplanar (not shown). The patterned mask 58 (see FIG. 3) may also be removed by the planarization process.

In some embodiments, the isolation regions 62 include a liner, e.g., a liner oxide (not shown), at the interface between the isolation region 62 and the substrate 50/semiconductor fins 64. In some embodiments, the liner oxide is formed to reduce crystalline defects at the interface between the substrate 50 and the isolation region 62. Similarly, the liner oxide may also be used to reduce crystalline defects at the interface between the semiconductor fins 64 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions 62. The isolation regions 62 are recessed such that the upper portions of the semiconductor fins 64 protrude from between neighboring STI regions 62. The top surfaces of the STI regions 62 may have a flat surface (as illustrated), a convex surface, a concave surface (such as dishing), or a combination thereof. The top surfaces of the STI regions 62 may be formed flat, convex, and/or concave by an appropriate etch. The isolation regions 62 may be recessed using an acceptable etching process, such as one that is selective to the material of the isolation regions 62. For example, a dry etch, or a wet etch using dilute hydrofluoric (dHF) acid, may be performed to recess the isolation regions 62.

FIGS. 2 through 4 illustrate an embodiment of forming fins 64, but fins may be formed in various different processes. For example, a top portion of the substrate 50 may be replaced by a suitable material, such as an epitaxial material suitable for an intended type (e.g., n-type or p-type) of semiconductor devices to be formed. Thereafter, the substrate 50, with epitaxial material on top, is patterned to form semiconductor fins 64 that comprise the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 64 may comprise silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
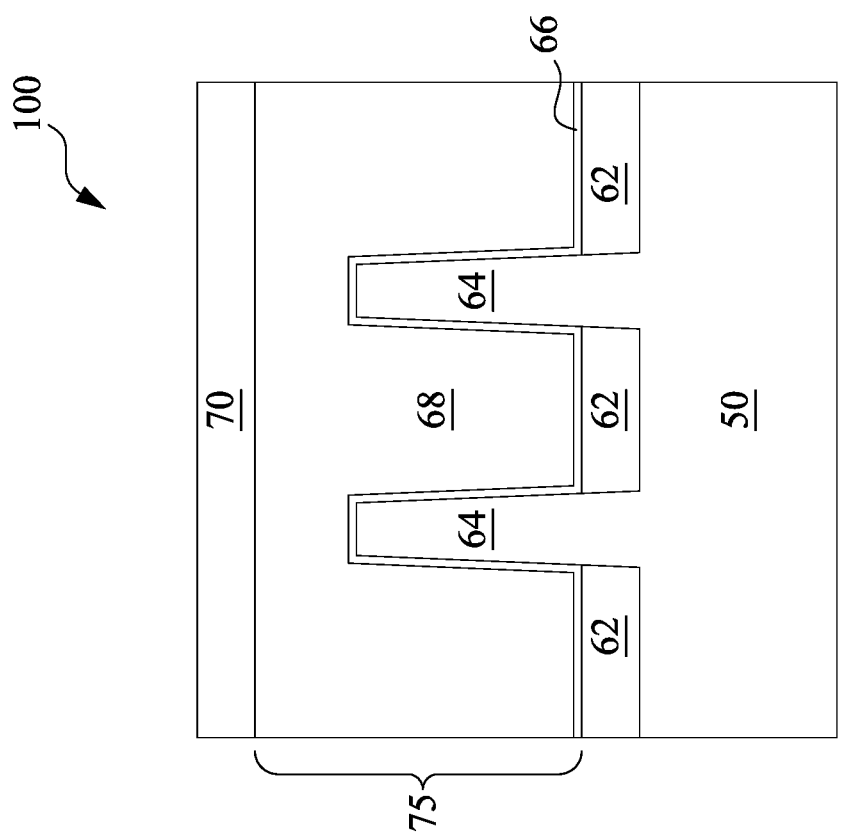

FIG. 5 illustrates the formation of dummy gate structure 75 over the semiconductor fins 64. Dummy gate structure 75 includes gate dielectric 66 and gate electrode 68, in some embodiments. A mask 70 may be formed over the dummy gate structure 75. To form the dummy gate structure 75, a dielectric layer is formed on the semiconductor fins 64. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form mask 70. The pattern of the mask 70 then may be transferred to the gate layer and the dielectric layer by an acceptable etching technique to form gate electrode 68 and gate dielectric 66, respectively. The gate electrode 68 and the gate dielectric 66 cover respective channel regions of the semiconductor fins 64. The gate electrode 68 may also have a lengthwise direction substantially perpendicular to the lengthwise direction of respective semiconductor fins 64.

The gate dielectric 66 is shown to be formed over the fins 64 (e.g., over top surfaces and sidewalls of the fins 64) and over the STI regions 62 in the example of FIG. 5. In other embodiments, the gate dielectric 66 may be formed by, e.g., thermal oxidization of a material of the fins 64, and therefore, may be formed over the fins 64 but not over the STI regions 62. These and other variations are fully intended to be included within the scope of the present disclosure.

Next, as illustrated in FIG. 6, lightly doped drain (LDD) regions 65 are formed in the fins 64. The LDD regions 65 may be formed by an implantation process. The implantation process may implant n-type or p-type impurities in the fins 64 to form the LDD regions 65. In some embodiments, the LDD regions 65 abut the channel region of the FinFET device 100. Portions of the LDD regions 65 may extend under gate electrode 68 and into the channel region of the FinFET device 100. FIG. 6 illustrates a non-limiting example of the LDD regions 65. Other configurations, shapes, and formation methods of the LDD regions 65 are also possible and are fully intended to be included within the scope of the present disclosure. For example, LDD regions 65 may be formed after gate spacers 87 are formed.

Still referring to FIG. 6, after the LDD regions 65 are formed, gate spacers 87 are formed on the gate structure. In the example of FIG. 6, the gate spacers 87 are formed on opposing sidewalls of the gate electrode 68 and on opposing sidewalls of the gate dielectric 66. The gate spacers 87 may be formed of silicon nitride, silicon oxynitride, silicon carbide, silicon carbonitride, the like, or a combination thereof, and may be formed using, e.g., a thermal oxidation, CVD, or other suitable deposition process.

The shapes and formation methods of the gate spacers 87 as illustrated in FIG. 6 are merely non-limiting examples, and other shapes and formation methods are possible. For example, the gate spacers 87 may include first gate spacers (not shown) and second gate spacers (not shown). The first gate spacers may be formed on the opposing sidewalls of the dummy gate structure 75. The second gate spacers may be formed on the first gate spacers, with the first gate spacers disposed between a respective gate structure and the respective second gate spacers. The first gate spacers may have an L-shape in a cross-sectional view. As another example, the gate spacers 87 may be formed after the epitaxial source/drain regions 80 (see FIG. 7) are formed. In some embodiments, dummy gate spacers are formed on the first gate spacers (not shown) before the epitaxial process of the epitaxial source/drain regions 80 illustrated in FIG. 7, and the dummy gate spacers are removed and replaced with the second gate spacers after the epitaxial source/drain regions 80 are formed. All such embodiments are fully intended to be included within the scope of the present disclosure.

Next, as illustrated in FIG. 7, source/drain regions 80 are formed. The source/drain regions 80 are formed by etching the fins 64 to form recesses, and epitaxially growing a material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 7, the epitaxial source/drain regions 80 may have surfaces raised from respective surfaces of the fins 64 (e.g. raised above the non-recessed portions of the fins 64) and may have facets. The source/drain regions 80 of the adjacent fins 64 may merge to form a continuous epitaxial source/drain region 80. In some embodiments, the source/drain regions 80 of adjacent fins 64 do not merge together and remain separate source/drain regions 80. In some example embodiments in which the resulting FinFET is an n-type FinFET, source/drain regions 80 comprise silicon carbide (SiC), silicon phosphorous (SiP), phosphorous-doped silicon carbon (SiCP), or the like. In alternative exemplary embodiments in which the resulting FinFET is a p-type FinFET, source/drain regions 80 comprise SiGe, and a p-type impurity such as boron or indium.

The epitaxial source/drain regions 80 may be implanted with dopants to form source/drain regions 80 followed by an anneal process. The implanting process may include forming and patterning masks such as a photoresist to cover the regions of the FinFET that are to be protected from the implanting process. The source/drain regions 80 may have an impurity (e.g., dopant) concentration in a range from about 1E19 $cm^{-3}$ to about 1E21 $cm^{-3}$. In some embodiments, the epitaxial source/drain regions may be in situ doped during growth.

In some embodiments, after the source/drain regions 80 are formed, a contact etch stop layer (CESL) (not shown) is formed over the source/drain regions 80, the dummy gate structures 75, and the gate spacers 87. The CESL functions as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, a first interlayer dielectric (ILD) 90 is formed over the fin 64 around the dummy gate structures 75. In some embodiments, the first ILD 90 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as CMP, may be performed to remove the mask 70 and to remove portions of the CESL disposed over the gate electrode 68, such that after the planarization process, the top surface of the first ILD 90 is level with the top surface of the gate electrode 68.

Next, in FIG. 8A, a gate-last process (sometimes referred to as replacement gate process) is performed to replace the gate electrode 68 and the gate dielectric 66 with an active gate (may also be referred to as a replacement gate or a metal gate) and active gate dielectric material(s), respectively. Therefore, the gate electrode 68 and the gate dielectric 66 may be referred to as dummy gate electrode and dummy gate dielectric, respectively, in a gate-last process. The active gate is a metal gate, in some embodiments.

Referring to FIG. 8A, the dummy gate structures 75 are replaced by replacement gate structures 97. In accordance with some embodiments, to form the replacement gate structures 97, the gate electrode 68 and the gate dielectric 66 directly under the gate electrode 68 are removed in an etching step(s), so that recesses (not shown) are formed between the gate spacers 87. Each recess exposes the channel region of a respective fin 64. During the dummy gate removal, the gate dielectric 66 may be used as an etch stop layer when the gate electrode 68 is etched. The gate dielectric 66 may then be removed after the removal of the gate electrode 68.

Next, a gate dielectric layer 94, a barrier layer 96, a work function layer 98, and a gate electrode 86 are formed in the recesses for the replacement gate structure 97. The gate dielectric layer 94 is deposited conformally in the recesses, such as on the top surfaces and the sidewalls of the fins 64, on sidewalls of the gate spacers 87, and on a top surface of the first ILD 90 (not shown). In accordance with some embodiments, the gate dielectric layer 94 comprises silicon oxide, silicon nitride, or multilayers thereof. In other embodiments, the gate dielectric layer 94 includes a high-K dielectric material, and in these embodiments, the gate dielectric layers 94 may have a K value (e.g., dielectric constant) greater than about 7.0, and may include a metal oxide or a silicate of Hf, Al, Zr, La, Mg, Ba, Ti, Pb, and combinations thereof. The formation methods of gate dielectric layer 94 may include molecular beam deposition (MBD), atomic layer deposition (ALD), PECVD, and the like.

Next, the barrier layer 96 is formed conformally over the gate dielectric layer 94. The barrier layer 96 may comprise an electrically conductive material such as titanium nitride, although other materials, such as tantalum nitride, titanium, tantalum, or the like, may alternatively be utilized. The barrier layer 96 may be formed using a CVD process, such as PECVD. However, other alternative processes, such as sputtering, metal organic chemical vapor deposition (MOCVD), or ALD, may alternatively be used.

Next, the work function layer 98, such as a p-type work function layer or an n-type work function layer, may be formed in the recesses over the barrier layers 96 and before the gate electrode 86 is formed, in some embodiments. Exemplary p-type work function metals that may be included in the gate structures for p-type devices include TiN, TaN, Ru, Mo, Al, WN, $ZrSi_2$, $MoSi_2$, $TaSi_2$, $NiSi_2$, other suitable p-type work function materials, or combinations thereof. Exemplary n-type work function metals that may be included in the gate structures for n-type devices include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), and/or other suitable process.

Next, a seed layer (not shown) is formed conformally over the work function layer 98. The seed layer may include copper, titanium, tantalum, titanium nitride, tantalum nitride, the like, or a combination thereof, and may be deposited by ALD, sputtering, PVD, or the like. In some embodiments, the seed layer is a metal layer, which may be a single layer or a composite layer comprising a plurality of sub-layers formed of different materials. For example, the seed layer comprises a titanium layer and a copper layer over the titanium layer.

Next, the gate electrode 86 is deposited over the seed layer, and fills the remaining portions of the recesses. The gate electrode 86 may be made of a metal-containing material such as Cu, Al, W, the like, combinations thereof, or multi-layers thereof, and may be formed by, e.g., electroplating, electroless plating, or other suitable method. After the formation of the gate electrode 86, a planarization process, such as a CMP, may be performed to remove the excess portions of the gate dielectric layer 94, the barrier layer 96, the work function layer 98, the seed layer, and the gate electrode 86, which excess portions are over the top surface of the first ILD 90. The resulting remaining portions of the gate dielectric layer 94, the barrier layer 96, the work function layer 98, the seed layer, and the gate electrode 86 thus form the replacement gate structure 97 (also referred to as the metal gate structure) of the resulting FinFET device 100. As illustrated in FIG. 8A, due to the planarization process, the metal gate structures 97, the gate spacers 87, and the first ILD 90 have a coplanar upper surface.

FIG. 8B illustrates a plan view of the FinFET device 100 of FIG. 8A. Note that for simplicity, not all features of the FinFET device 100 are illustrated in FIG. 8B. In particular, FIG. 8B illustrates four fins 64 (e.g., 64A, 64B, 64C, and 64D) and four metal gate structures 97 (e.g., 97A, 97B, 97C, and 97D) over the fins 64 when viewed from the top (e.g., in a top view). FIG. 8B further illustrates, in dashed lines, example locations for openings 104, 110, and 112 formed in subsequent processing. In addition, cross-sections A-A, B-B, C-C, and D-D in FIG. 1 are also illustrated in FIG. 8B. The number of fins 64 and the number of metal gate structures 97 illustrated in FIG. 8B (and other figures) are for illustration purpose and non-limiting, other numbers are also possible and are fully intended to be included within the scope of the present disclosure.

Next, in FIGS. 9A-9D, an etch stop layer 101 is formed over the first ILD 90, and a hard mask layer 103 is formed over the etch stop layer 101. The etch stop layer 101 may be formed of a material different from, e.g., silicon nitride and silicon oxide to provide etching selectivity. For example, the etch stop layer 101 may be formed of a carbon based nitride (e.g., silicon carbonitride, silicon carbon oxynitride) or a metal nitride (e.g., boron nitride, aluminum nitride), using a suitable formation method such as CVD, PECDV, ALD, or the like. The hard mask layer 103 may be formed of a suitable material such as silicon nitride, using CVD, PECVD, or the like, as examples. Note that for simplicity, in FIGS. 9A-9D and subsequent figures, the LDD regions 65 are not shown, and the details (e.g., various layers) of the metal gate structure 97 are not illustrated.

Figure 17:
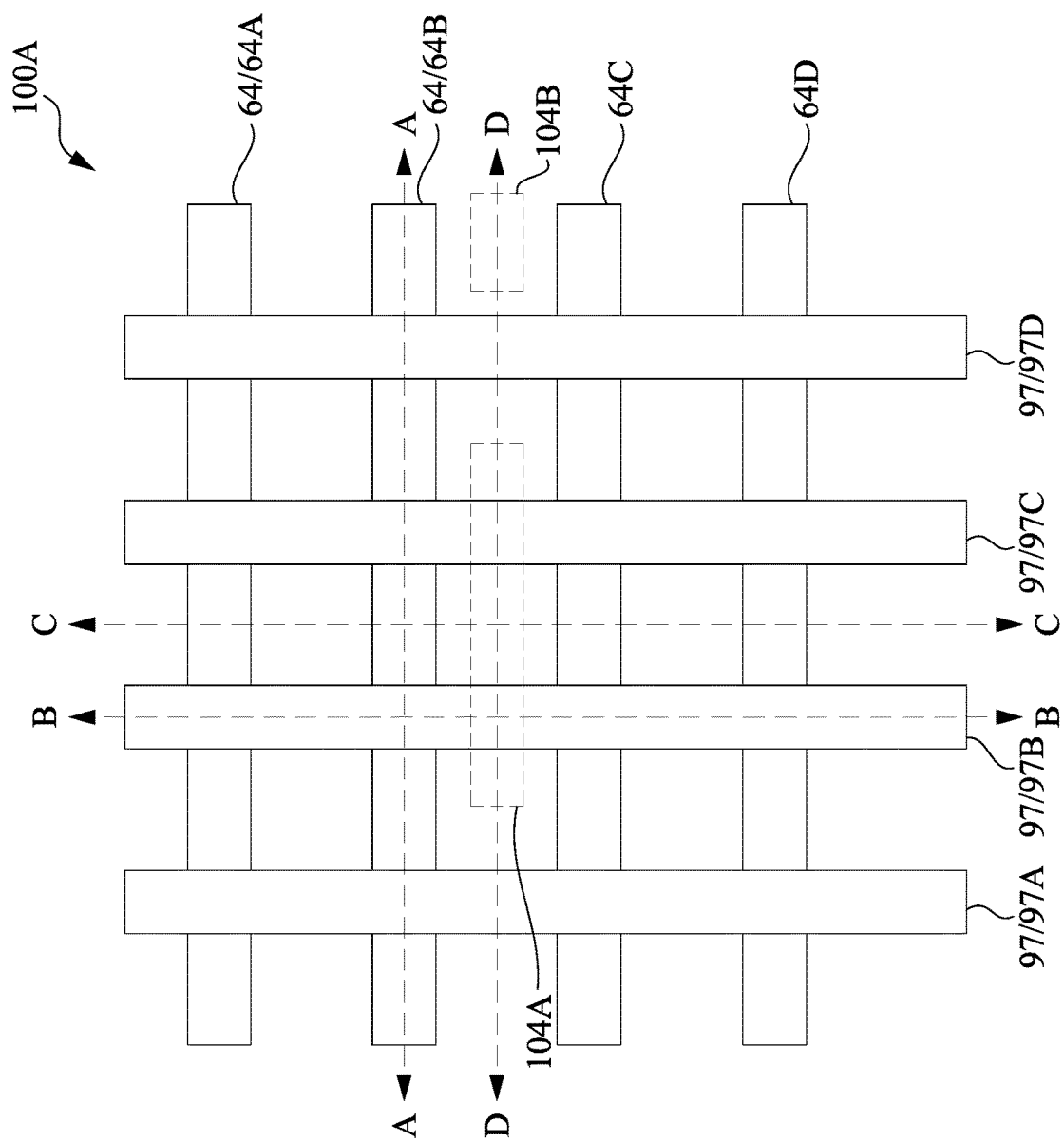
FIG. 17 illustrates a top view of FinFET device, in accordance with an embodiment.
Figure 18:
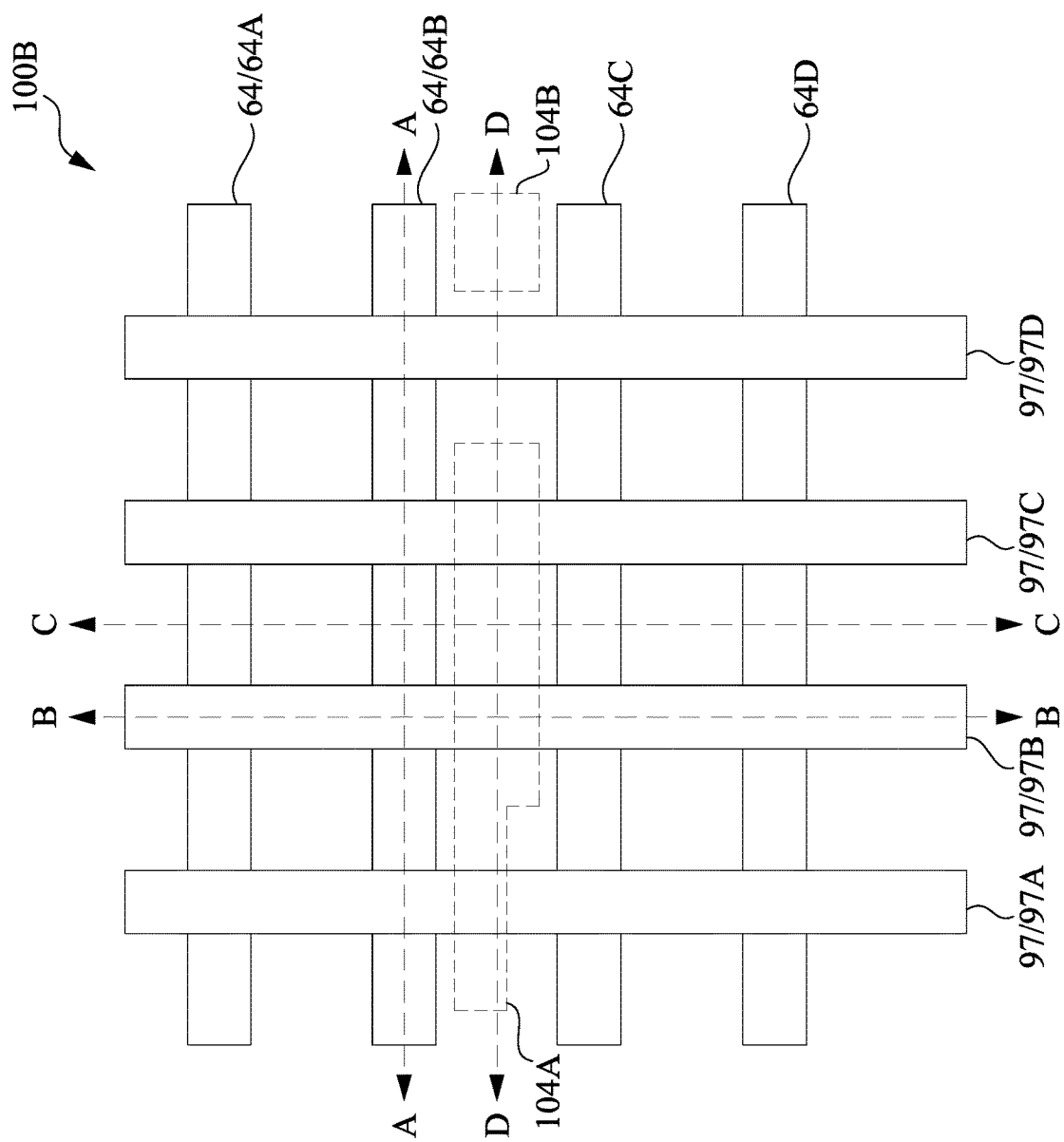
FIG. 18 illustrates a top view of FinFET device, in accordance with another embodiment.
Figure 19:
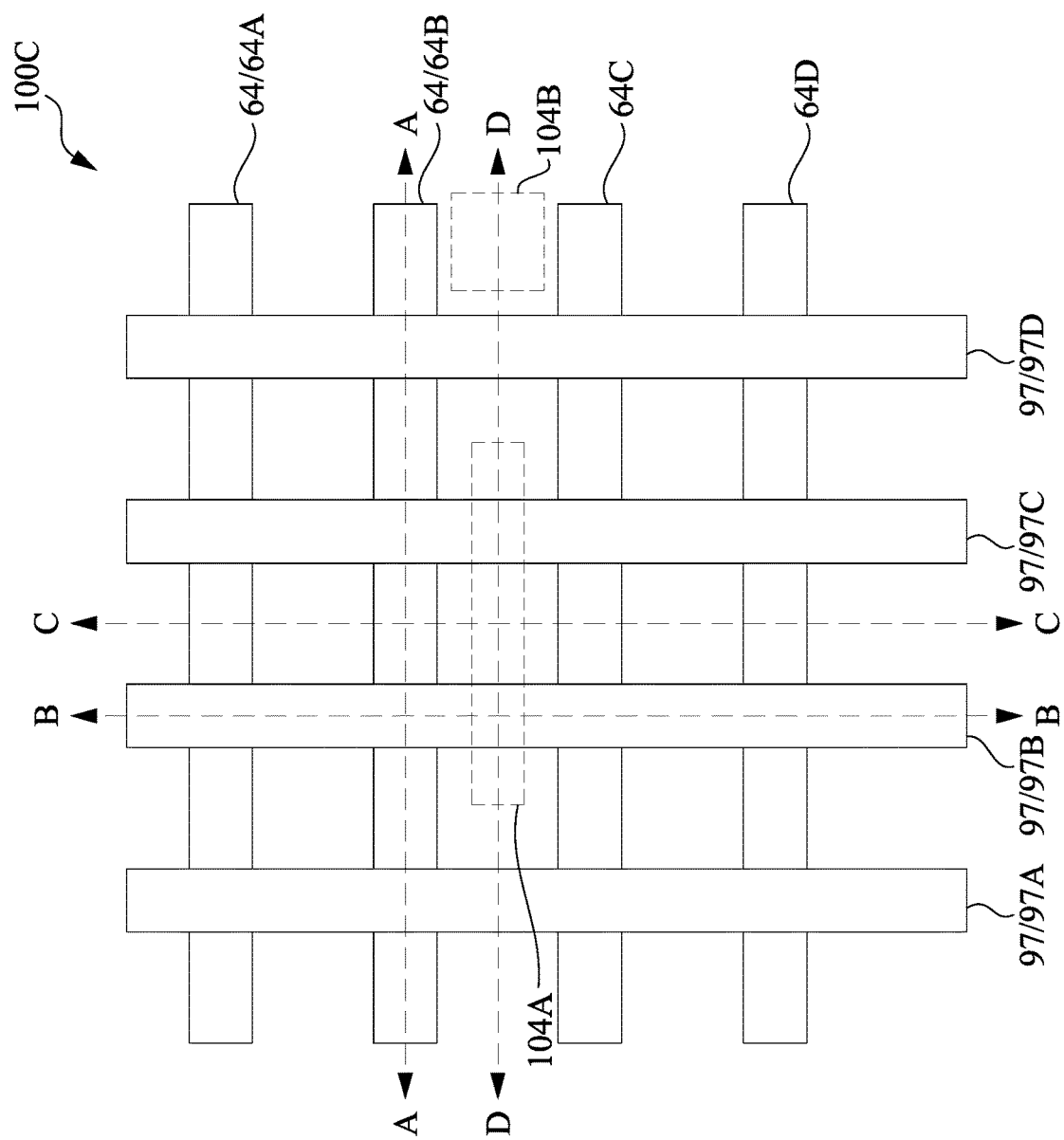
FIG. 19 illustrates a top view of FinFET device, in accordance with yet another embodiment.

Next, an opening 104 is formed in the hard mask layer 103. The opening 104 may be formed using photolithography and etching techniques. Due to the etching selectivity between the hard mask layer 103 and the etch stop layer 101, the etching process to form the opening 104 etches through the hard mask layer 103 and stops at (e.g., exposes) the etch stop layer 101. As illustrated in FIGS. 8B and 9A-9D, the opening 104 is formed between, and spaced apart from, adjacent fins 64 (e.g., 64C and 64B). In the illustrated example, the longitudinal axis of the opening 104, which is along the direction of cross-section D-D, is parallel to the longitudinal axis of the fins 64, and the opening 104 overlaps with three metal gate structures 97B, 97C, and 97D in the top view of FIG. 8B. Note that the number of the opening 104, as well as the location, the shape, and the dimensions of the opening 104 illustrated in FIGS. 8B and 9A-9D are merely non-limiting examples, as one skilled in the art readily appreciates. Other variations and modifications are possible and are fully intended to be included within the scope of the present disclosure. For example, FIGS. 17-19 illustrate additional examples for the openings 104, details of which are discussed hereinafter.

Next, in FIGS. 10A-10D, a re-deposition layer 102, which is optional, is conformally formed over the hard mask layer 103 and in the opening 104. In the illustrated embodiment, the re-deposition layer 102 is formed of a same material (e.g., SiN) as the hard mask layer 103. The re-deposition layer 102 may be formed by CVD, ALD, or the like. A thickness of the re-deposition layer 102 may be between about 5 angstroms and about 10 angstroms, as an example. The re-deposition layer 102 may be formed to reduce the dimension of the opening 104, which opening 104 is used in a subsequent cut-metal gate process to cut some of the metal gate structures 97. In addition, the re-deposition layer 102 may reduce damage to the fins 64 during the etching process of the cut-metal gate process. In some embodiments, the re-deposition layer 102 is omitted.

Figure 11A:
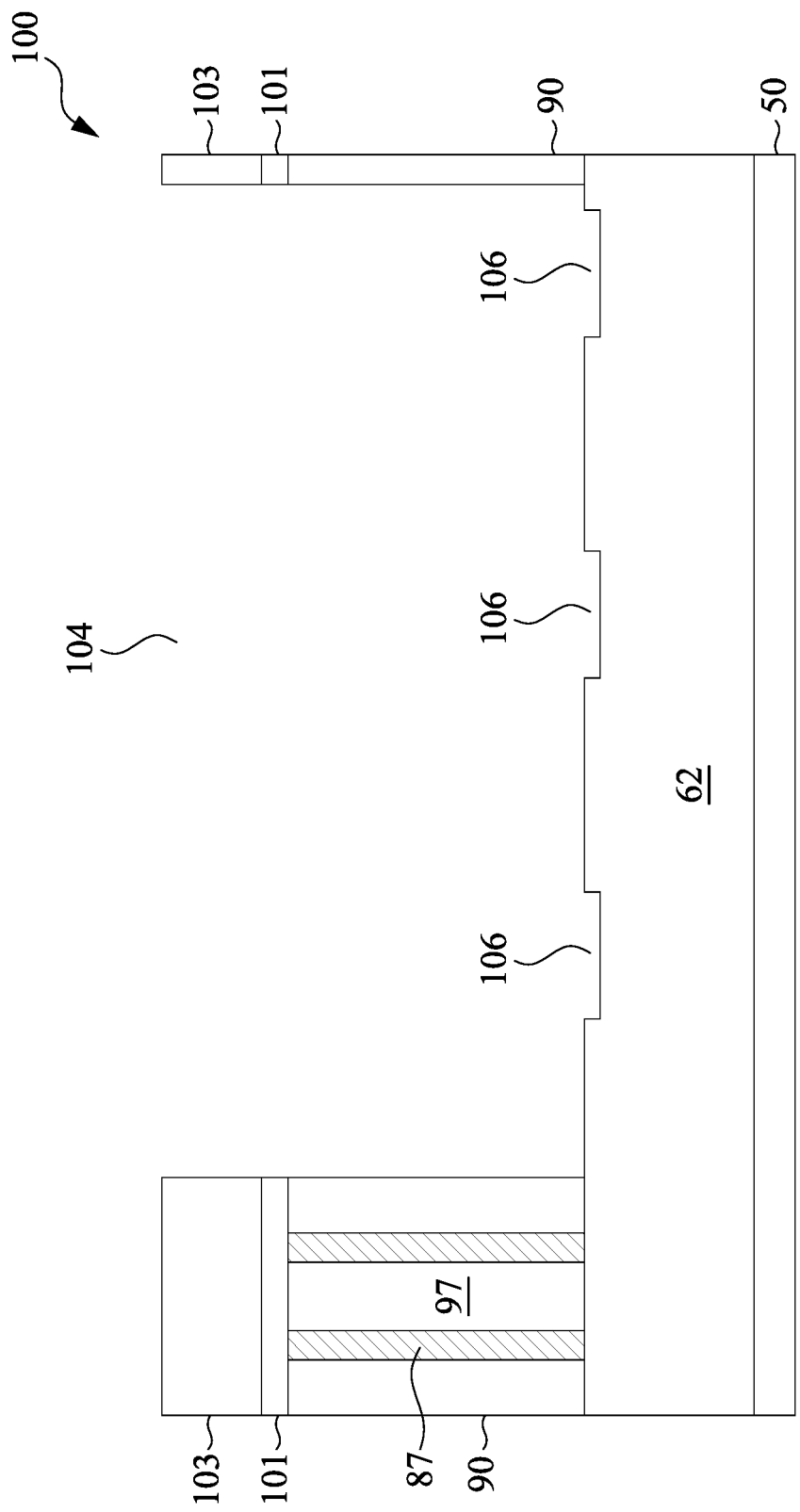
Figure 11B:
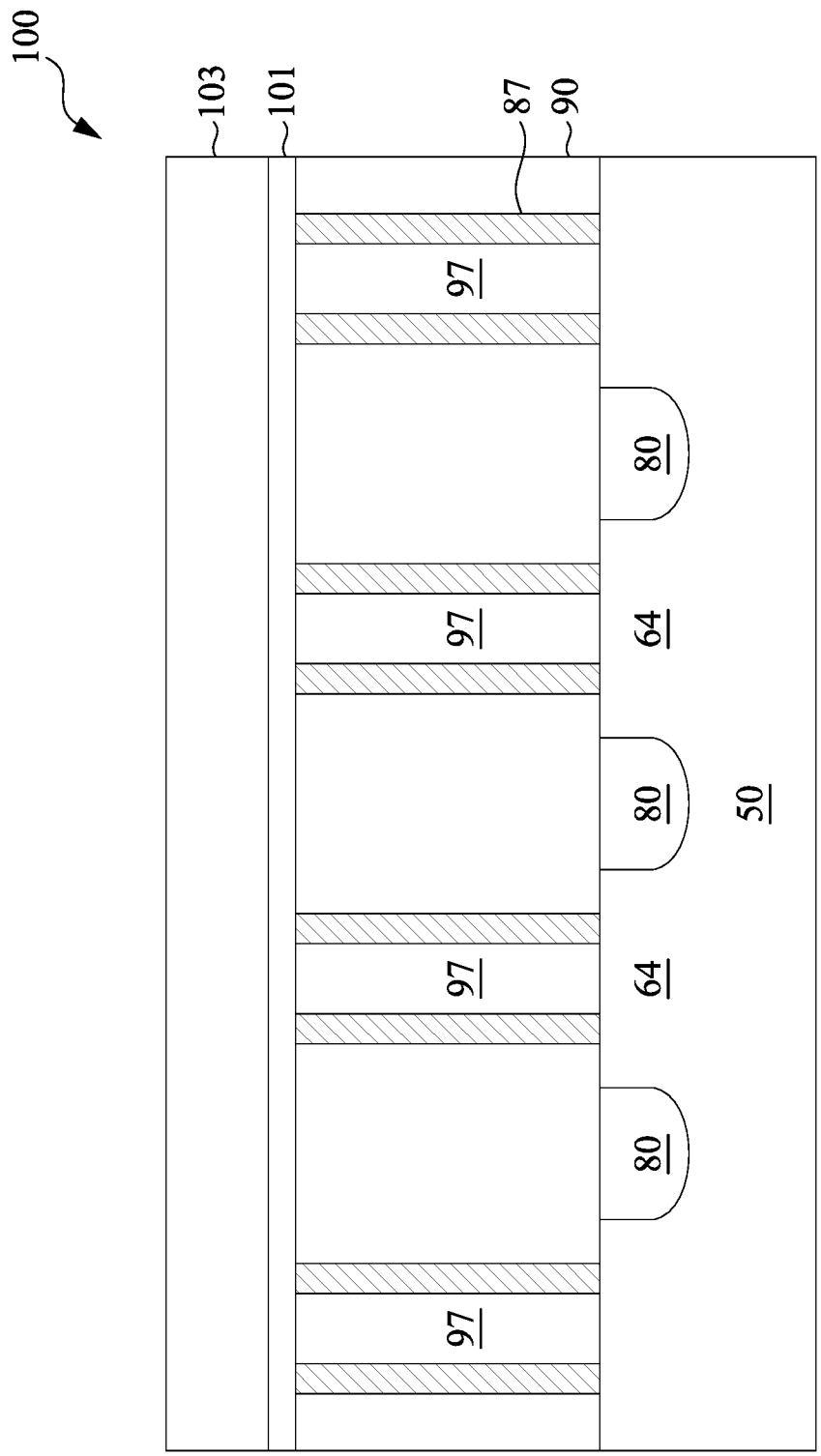
Figure 11D:
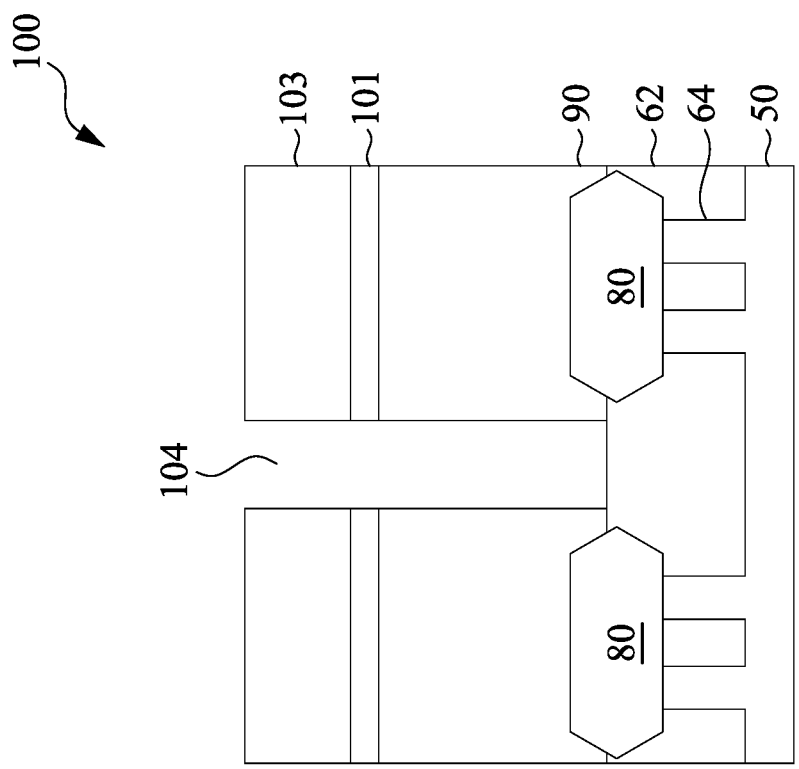
Figure 11C:
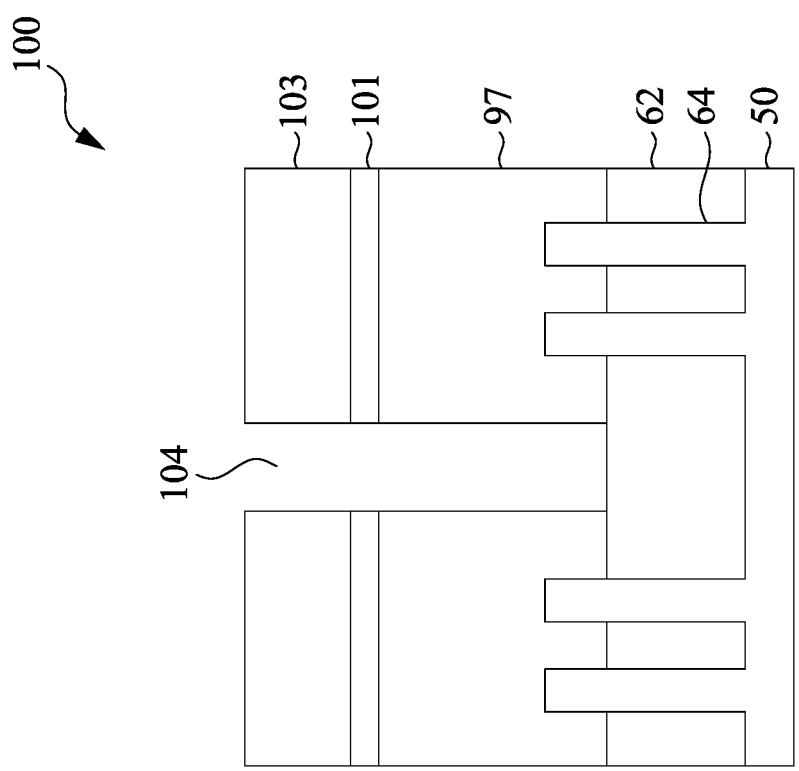

Next, in FIGS. 11A-11D, a plurality of etching processes are performed to remove portions of the first ILD 90, portions of the metal gate structures 97, and portions of the corresponding gate spacers 87 that are directly under the opening 104. In other words, the opening 104 is extended through the etch stop layer 101 and the first ILD 90, such that the STI regions 62 are exposed. The portion of the opening 104 below the hard mask layer 103 may also be referred to as a trench 104. As illustrated in FIG. 11C, the opening 104 separates (e.g., cuts) each of the metal gate structures 97 (see, e.g., 97B, 97C, and 97D in FIG. 8B) that intersect the opening 104 into two separate metal gate structures. This may be referred to as a cut-metal gate process. In the example of FIG. 11A, the plurality of etching processes may over-etch at locations where the removed metal gate structures 97 used to be, and therefore, may form recesses 106 that extends into the STI regions 62.

In some embodiments, the plurality of etching processes include a first dry etch process, a wet etch process, and a second dry etch process performed sequentially. The first dry etch process (e.g., a plasma process) is performed to break through (e.g., remove) the re-deposition layer 102, and may be performed using an etching gas comprising $CH_3F$, Ar, He, $O_2$, combinations thereof, or the like. Next, the wet etch process is performed using, e.g., a mixture of hydrochloric acid (HCl) and de-ionized water (DIW). The wet etch process may be performed to clean (e.g., remove) residues and/or by-products from the first dry etch process. Next, the second dry etch process (e.g., a plasma process) is performed to remove the remaining layers/structures underlying the opening 104, and may be performed using an etching gas comprising $Cl_2$, $SiCl_4$, $CH_4$, $CF_4$, $BCl_3$, Ar, $O_2$, combinations thereof, or the like.

Next, in FIGS. 12A-12D, a first dummy material 105 (may also be referred to as a sacrificial material) is formed to fill the opening 104. In some embodiments, the first dummy material 105 is formed of a material that provides etching selectivity with the materials of other layers/structures (e.g., the first ILD 90, the etch stop layer 101, the STI regions 62, the fin 64, the source/drain regions 80, the metal gate structure 97, the subsequently formed liner layer 111 and contacts 113) in a subsequent etching process to remove the first dummy material 105 (see FIG. 15A-15D). The first dummy material 105 may be a suitable semiconductor material (e.g., Si or Ge) or a suitable metal oxide material (e.g., $Al_2O_3$, $Ga_2O_3$, $TiO_2$, $In_2O_3$, ZnO). A suitable formation method, such as PVD, CVD, ALD, or the like, may be performed to form the first dummy material 105.

Figure 12A:
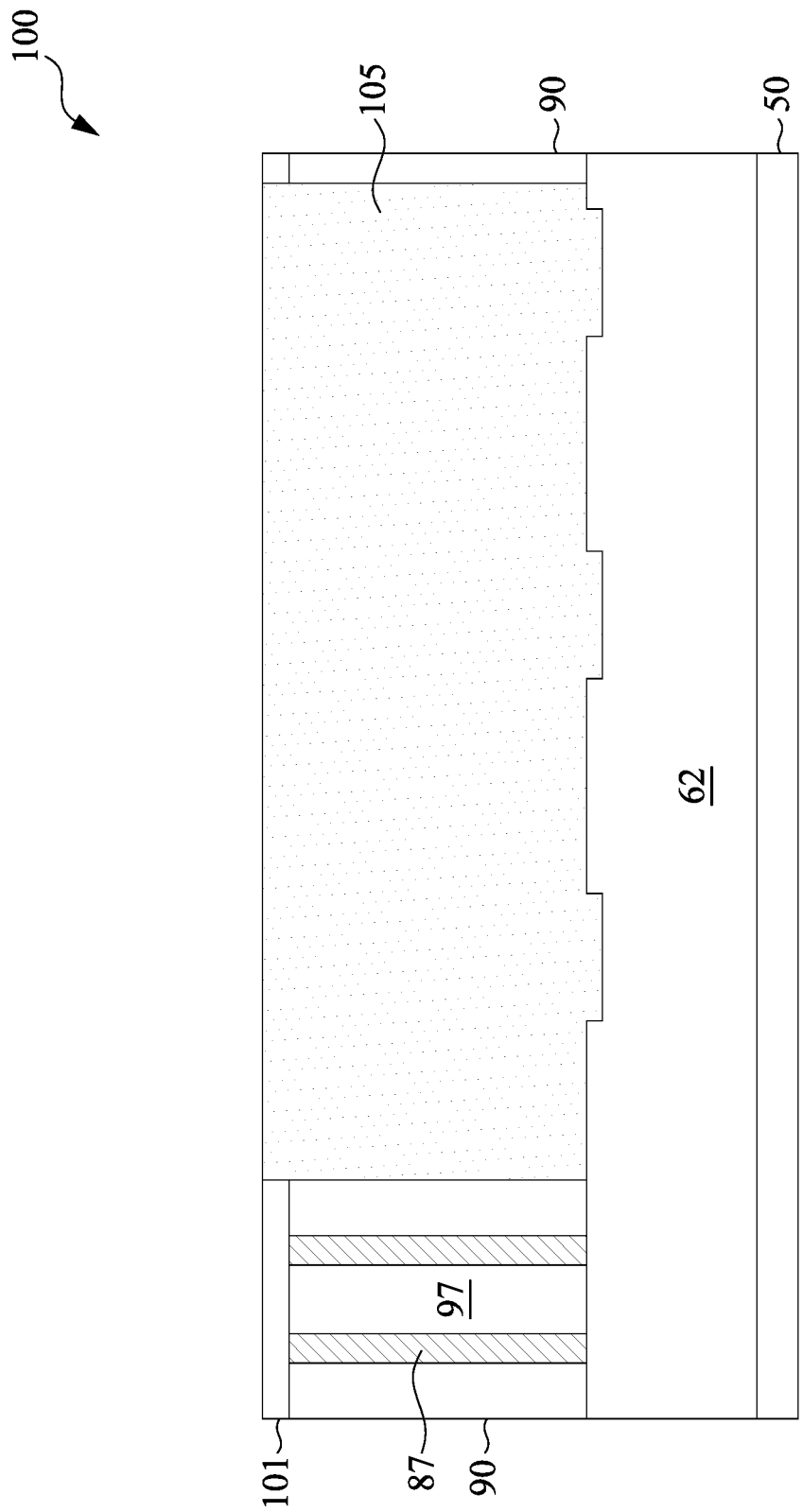
Figure 12B:
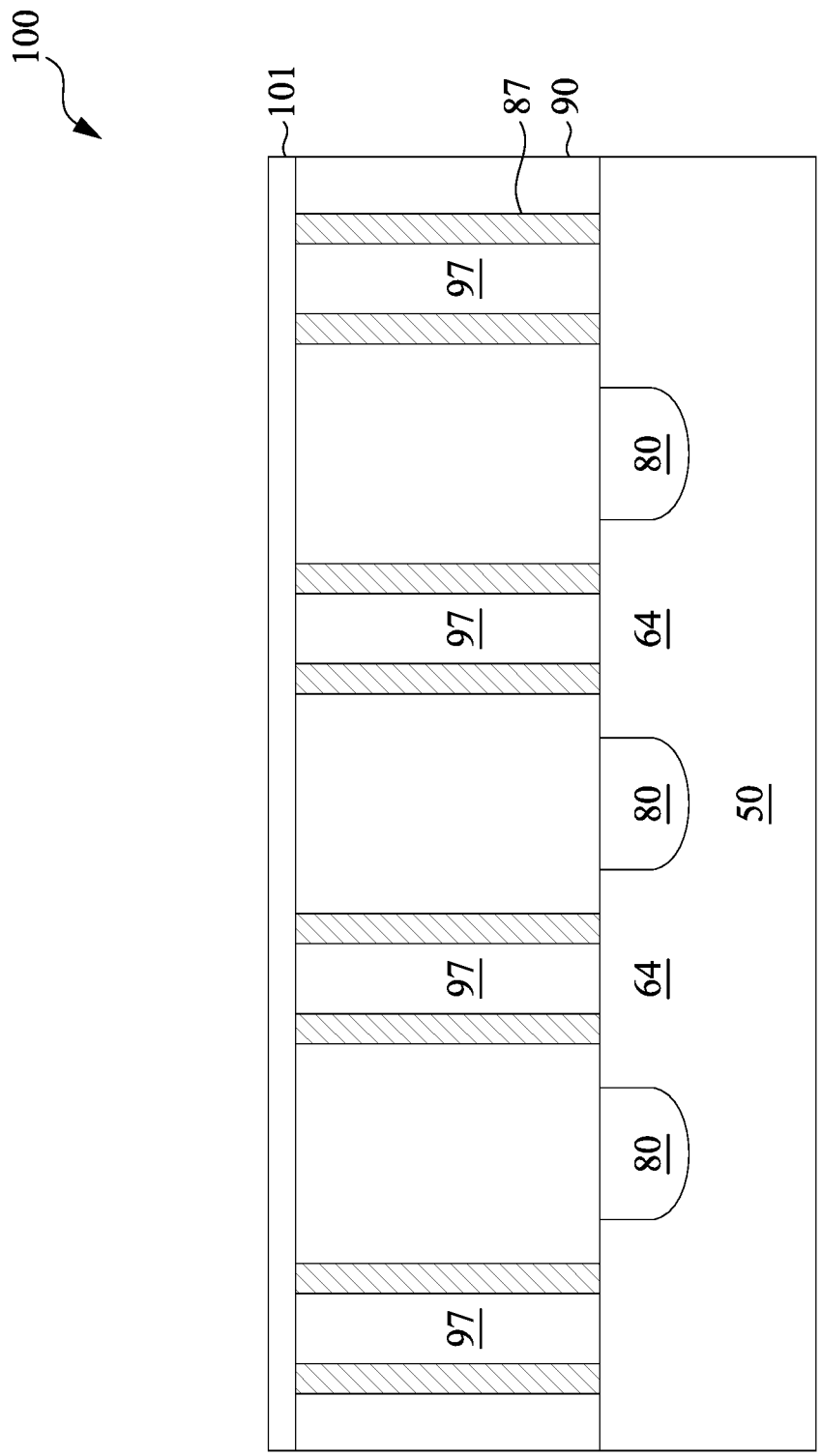
Figure 12D:
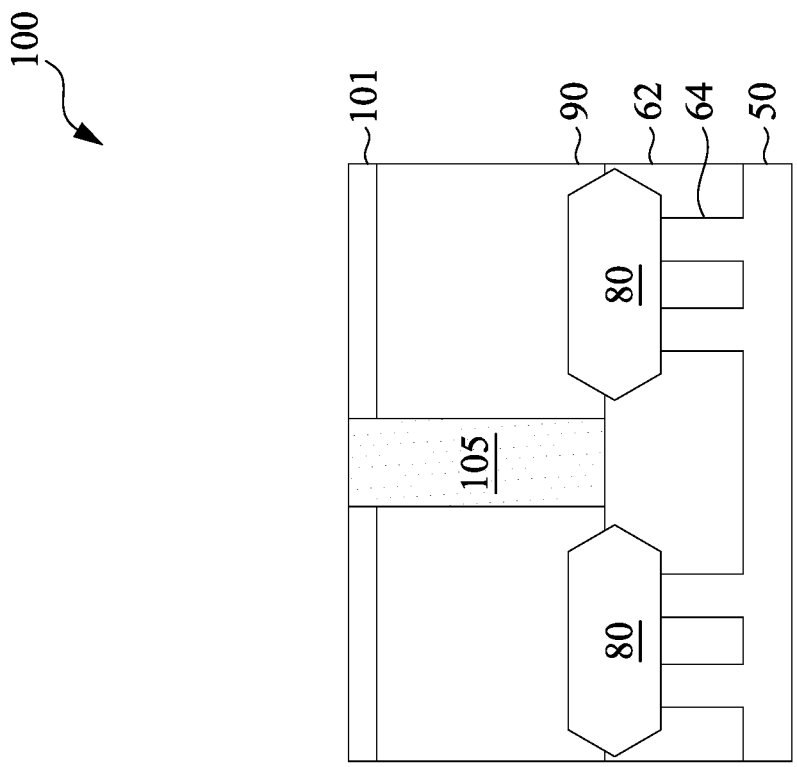
Figure 12C:
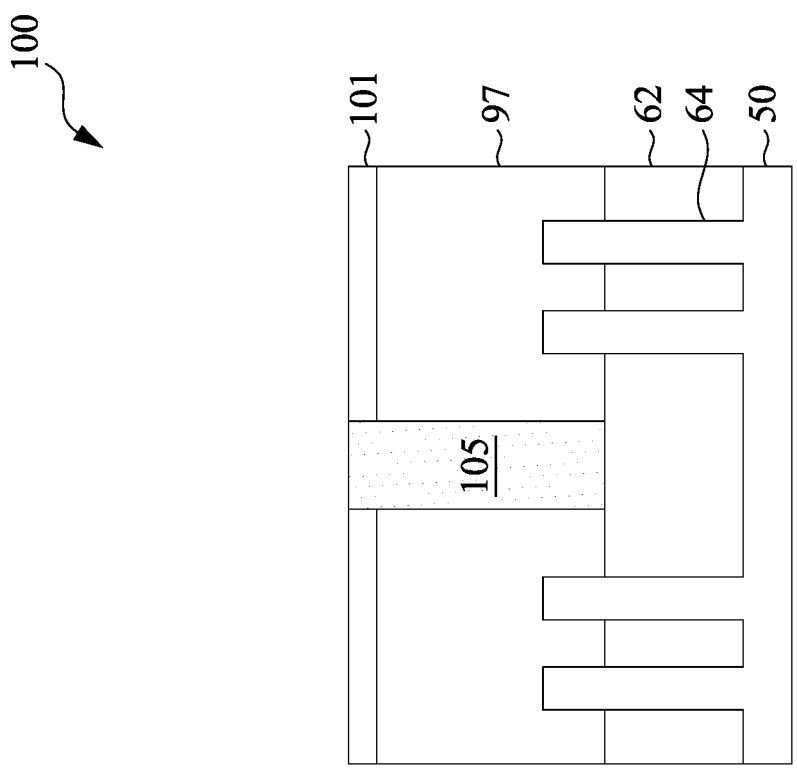

After the first dummy material 105 is formed, a planarization process, such as CMP, is performed to remove excess portions of the first dummy material 105 that are disposed outside of the opening 104. The planarization process may also remove the hard mask layer 103. As illustrated in FIGS. 12A, 12C, and 12D, after the planarization process, the etch stop layer 101 is exposed, and the first dummy material 105 and the etch stop layer 101 have a coplanar (e.g., level) upper surface.

Next, in FIGS. 13A-13D, a second ILD 107 is formed over the etch stop layer 101 and over the first dummy material 105. The second ILD 107 may be formed of a same material as the first ILD 90 by a same or similar formation method, thus details are not repeated. Next, openings 110 and 112 are formed that extend through the second ILD 107, the etch stop layer 101, and the first ILD 90 using, e.g., photolithography and etching techniques. One skilled in the art will readily appreciate that the number, the location, and the dimension of the openings 110/112 as illustrated are for illustration purpose only and non-limiting.

Figure 13A:
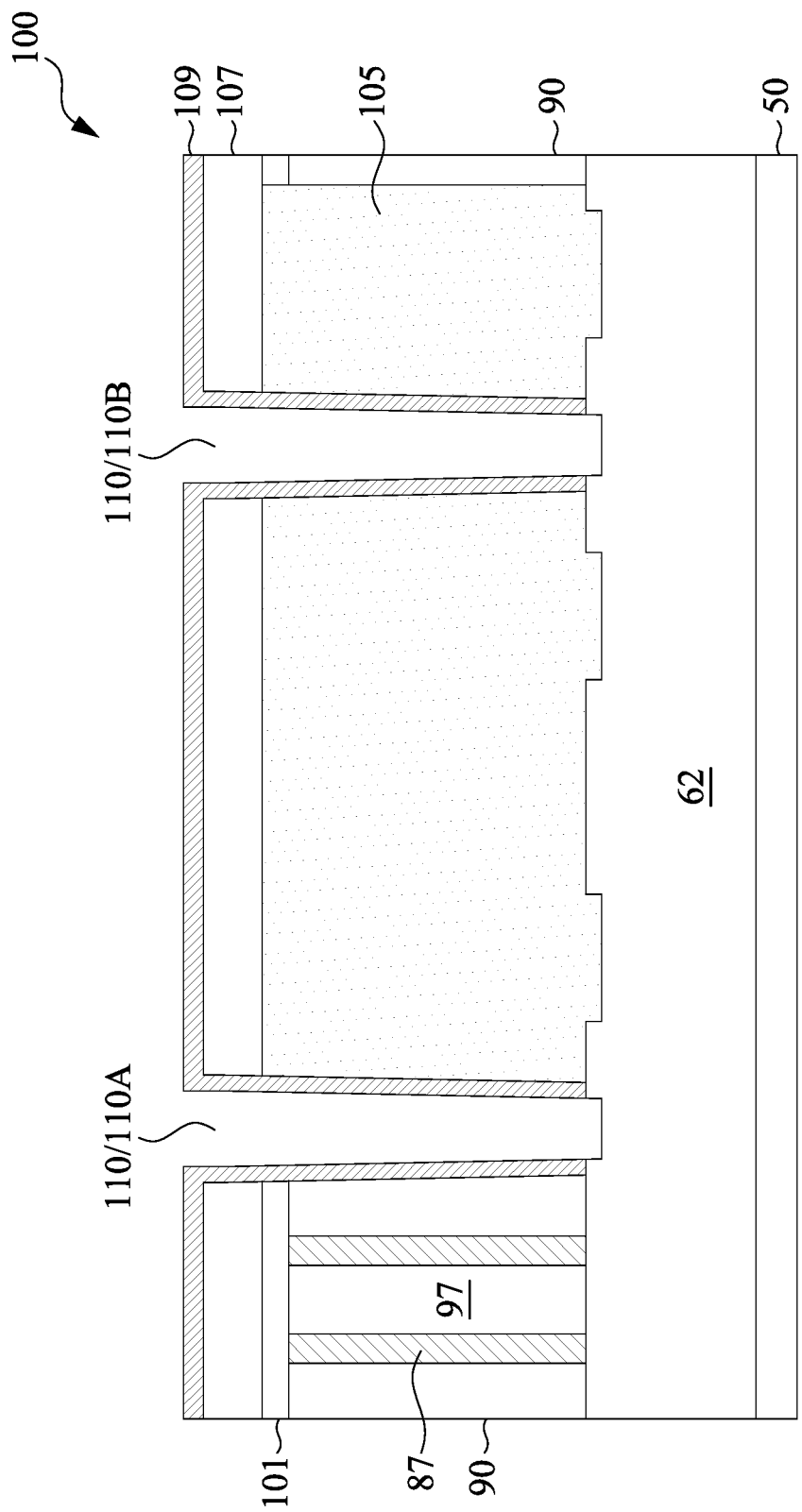
Figure 13B:
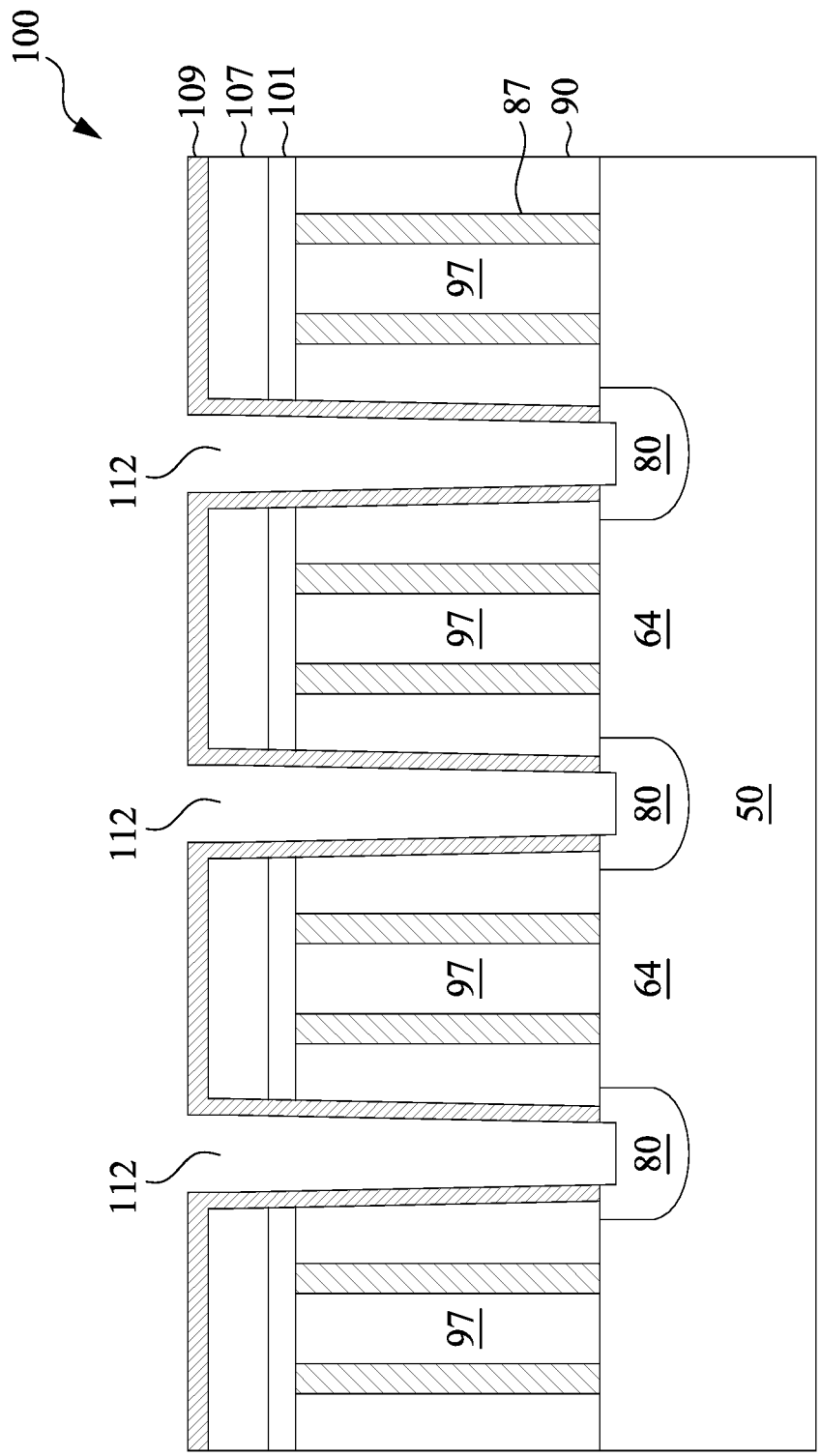
Figure 13D:
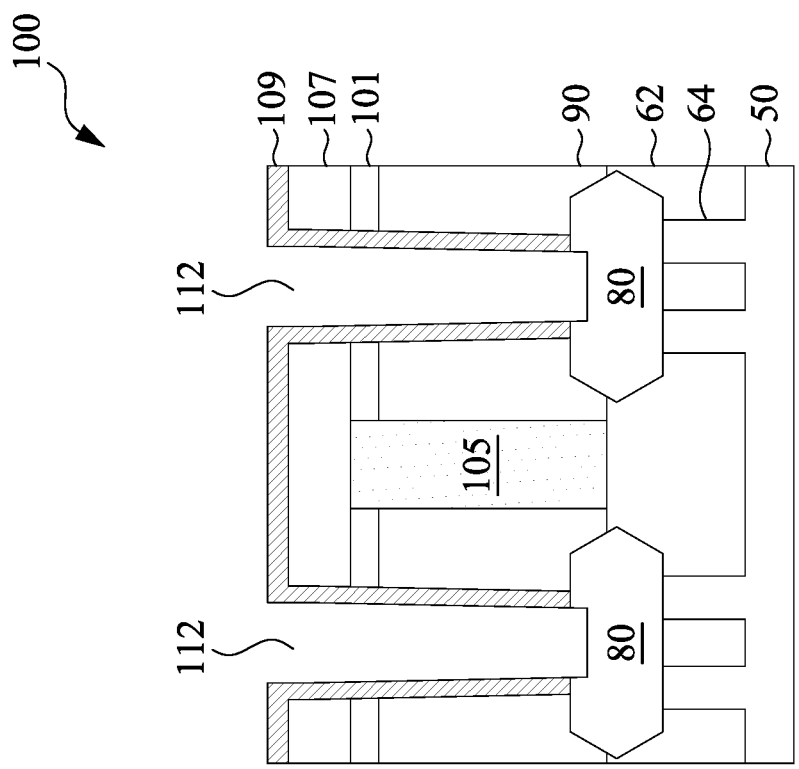
Figure 13C:
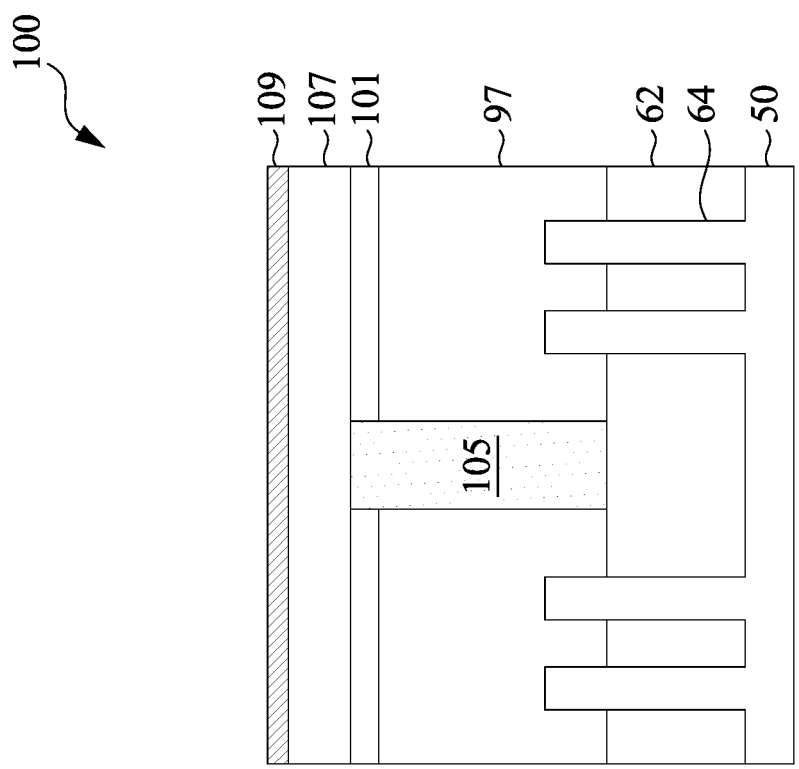
Figure 14A:
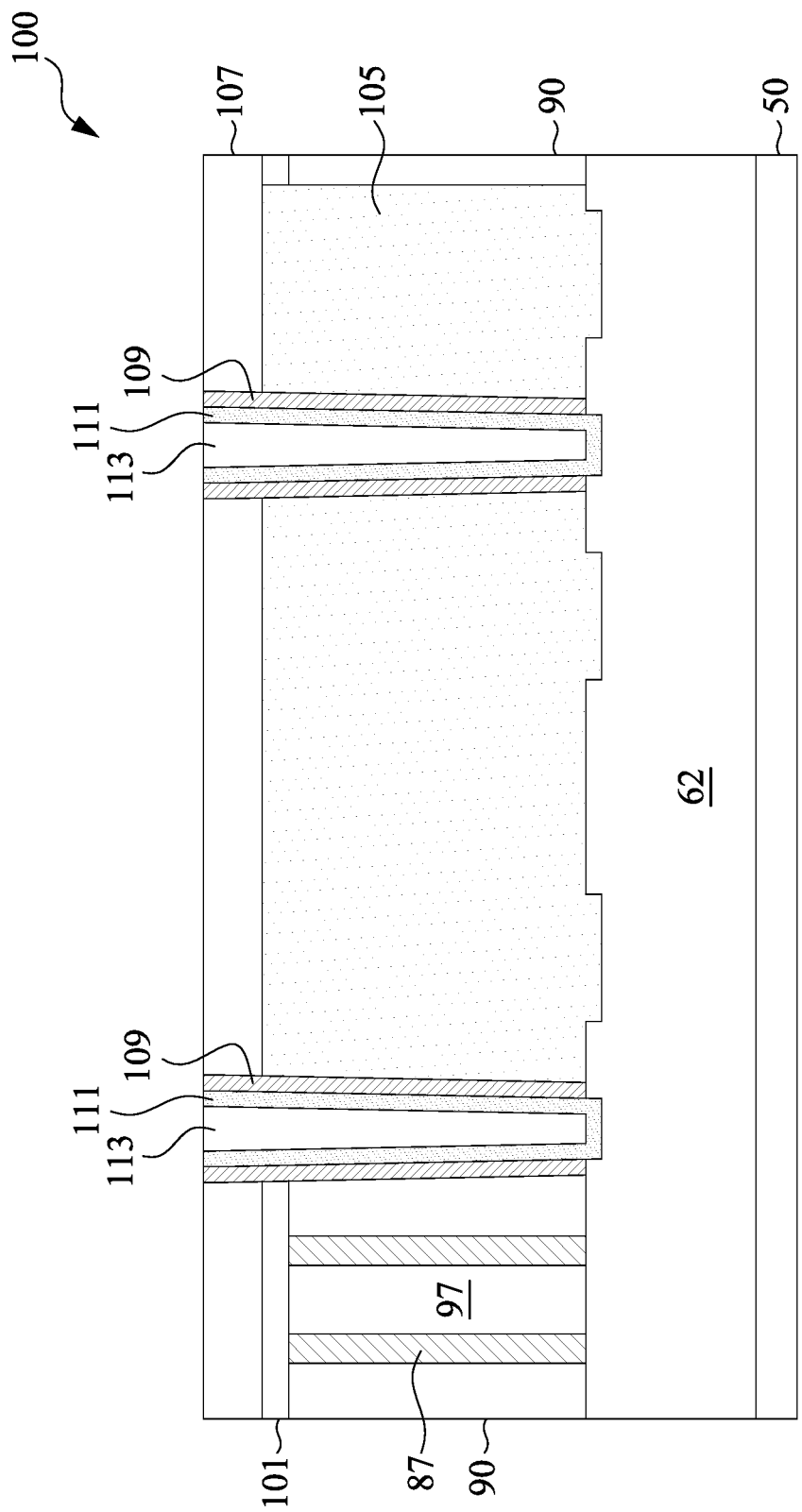
Figure 14B:
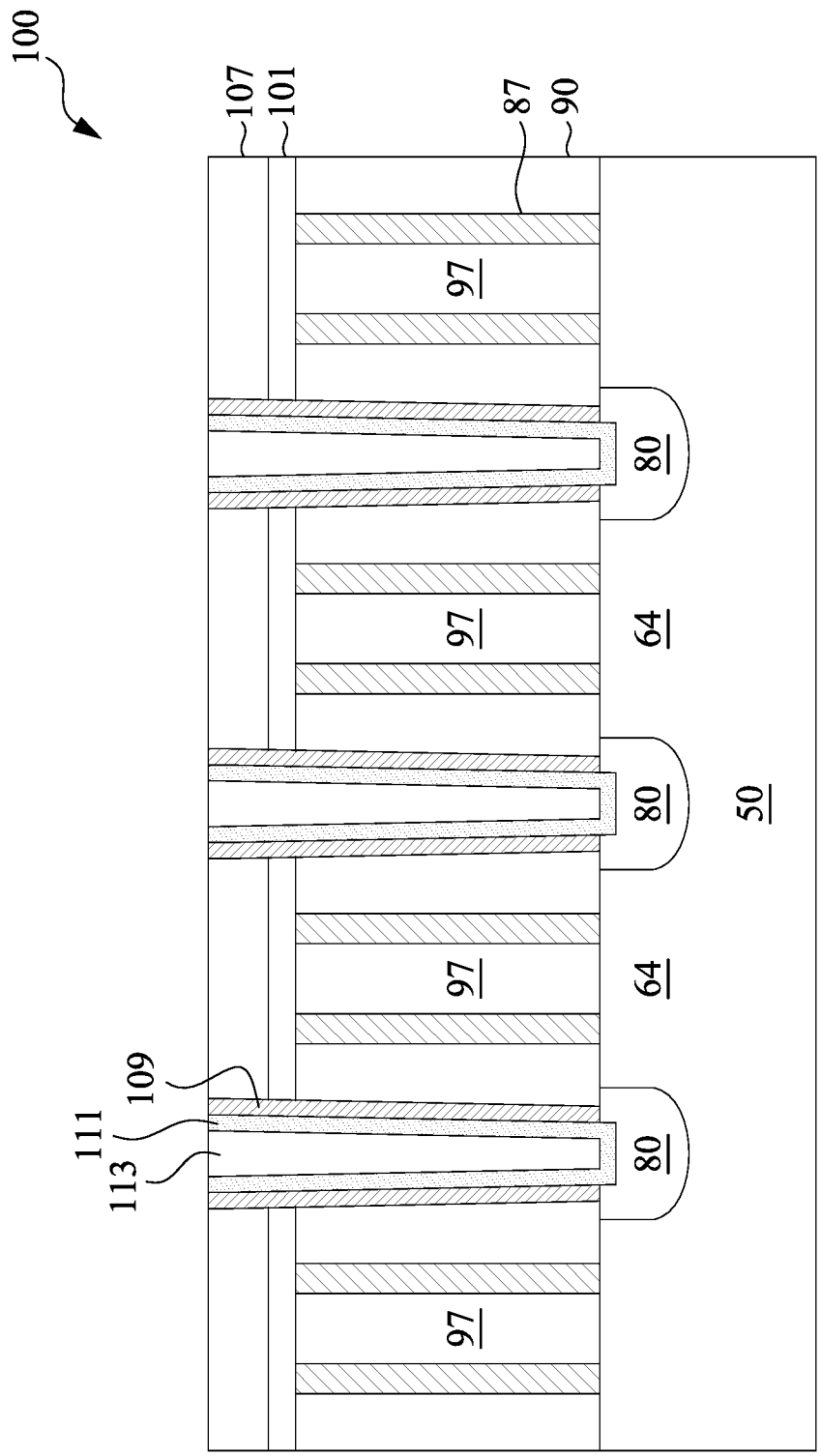
Figure 14D:
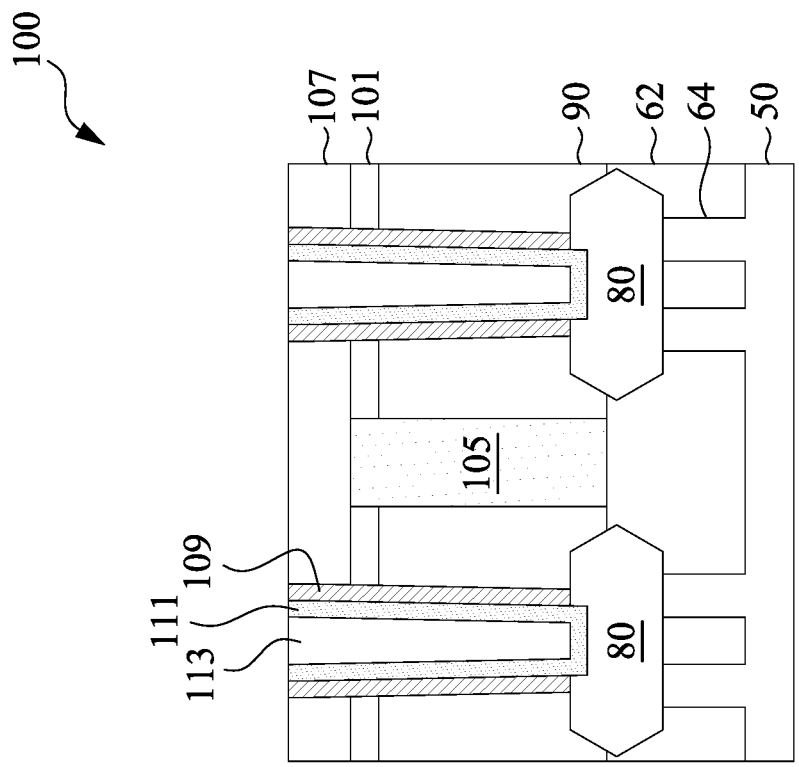
Figure 14C:
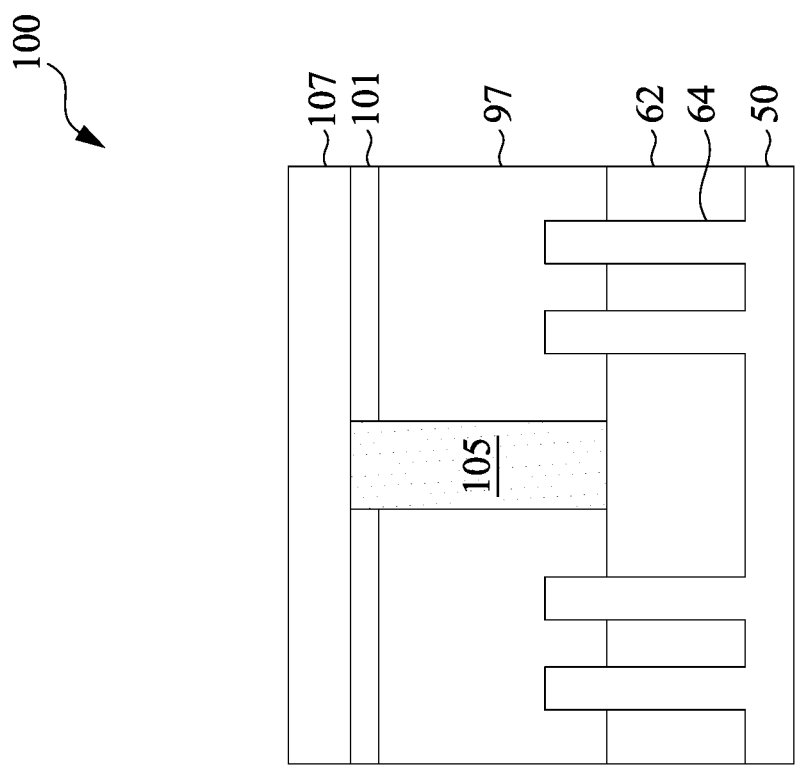
Figure 15A:
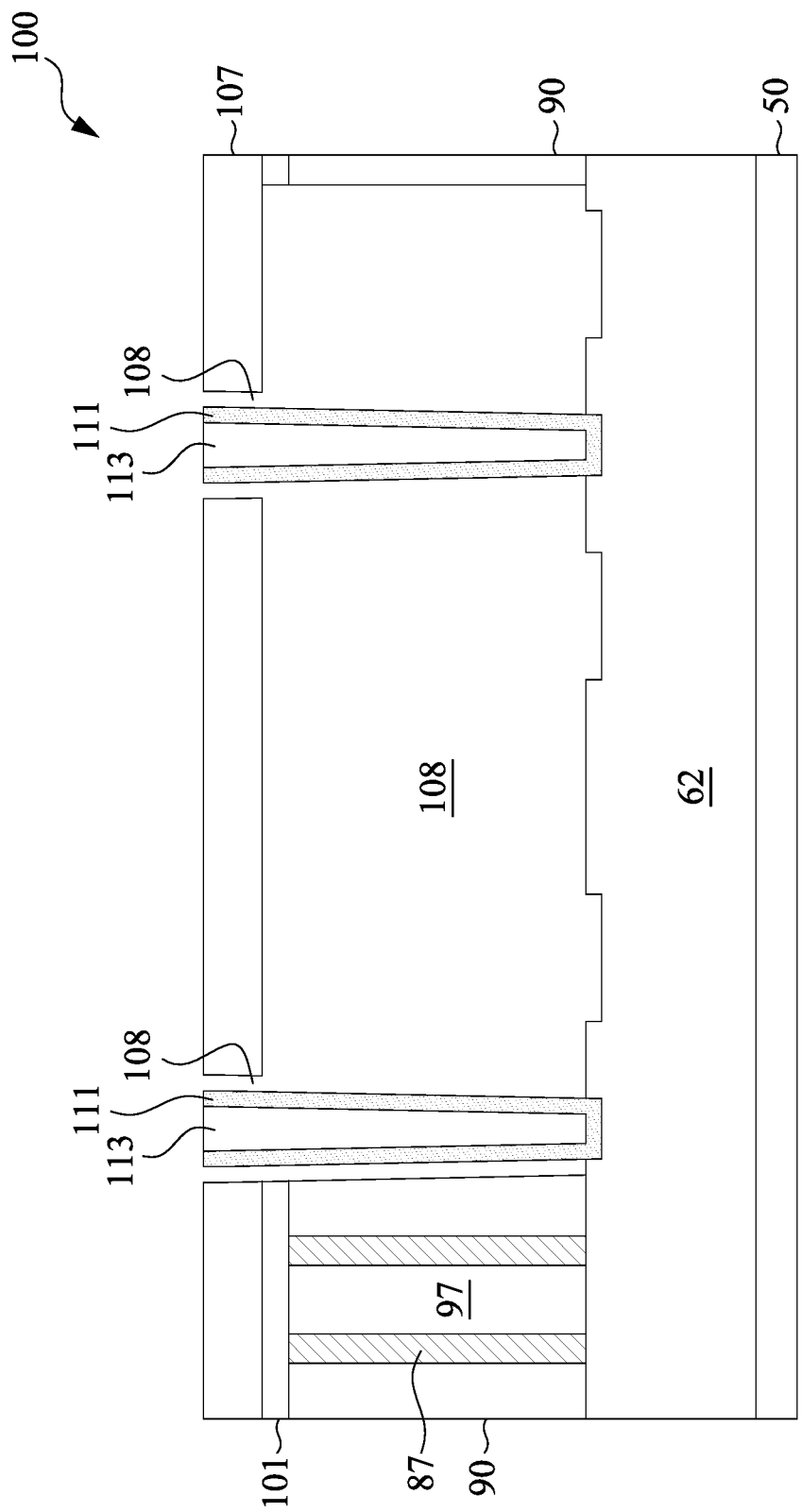
Figure 15B:
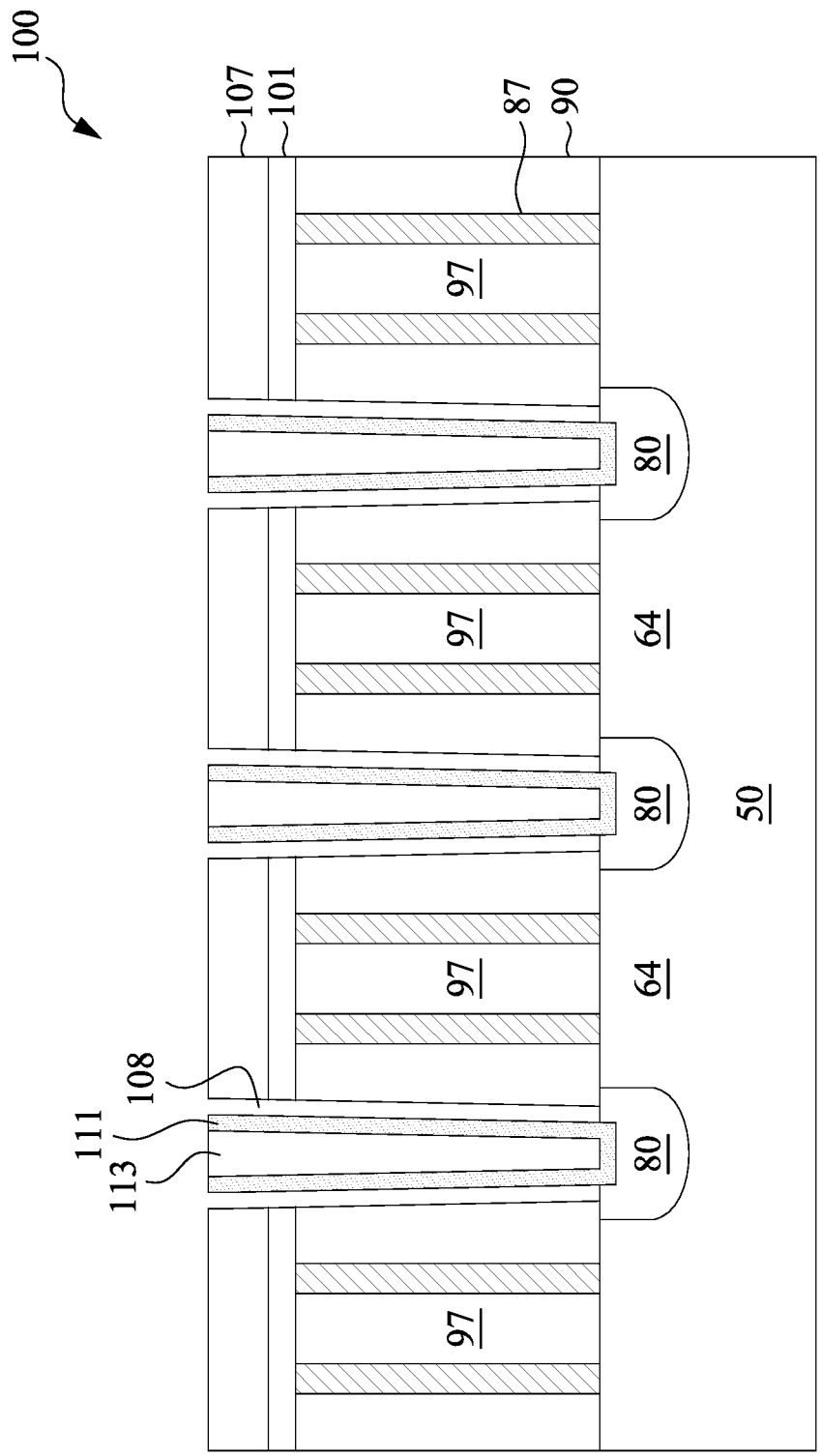
Figure 15D:
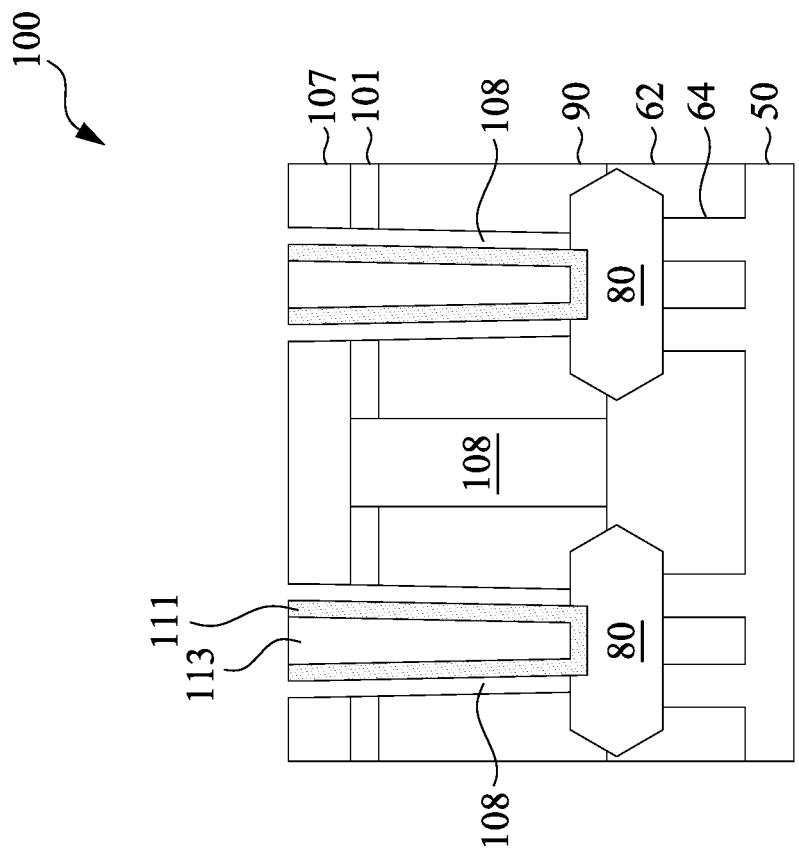
Figure 15C:
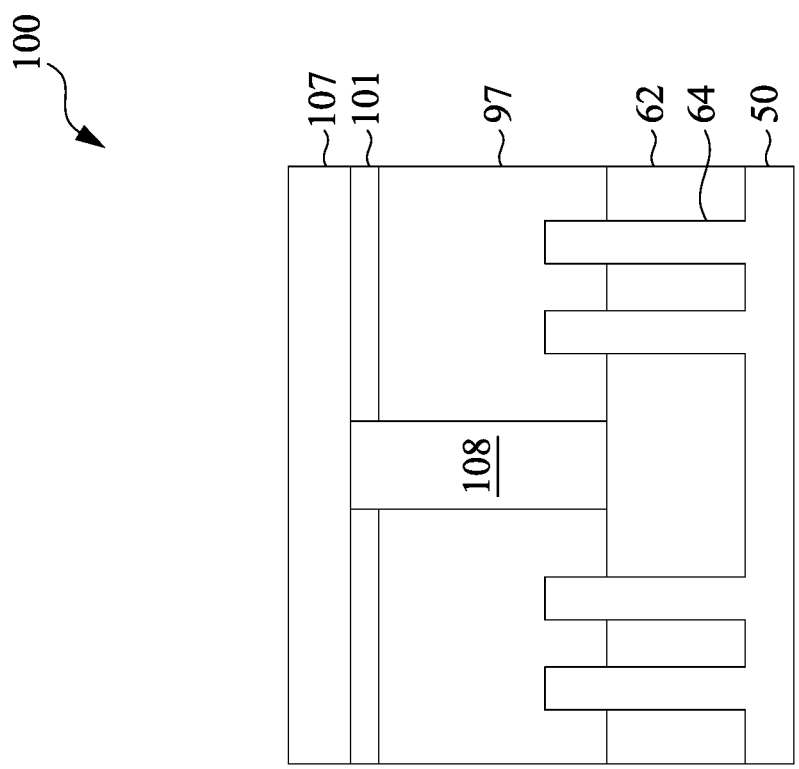
Figure 16A:
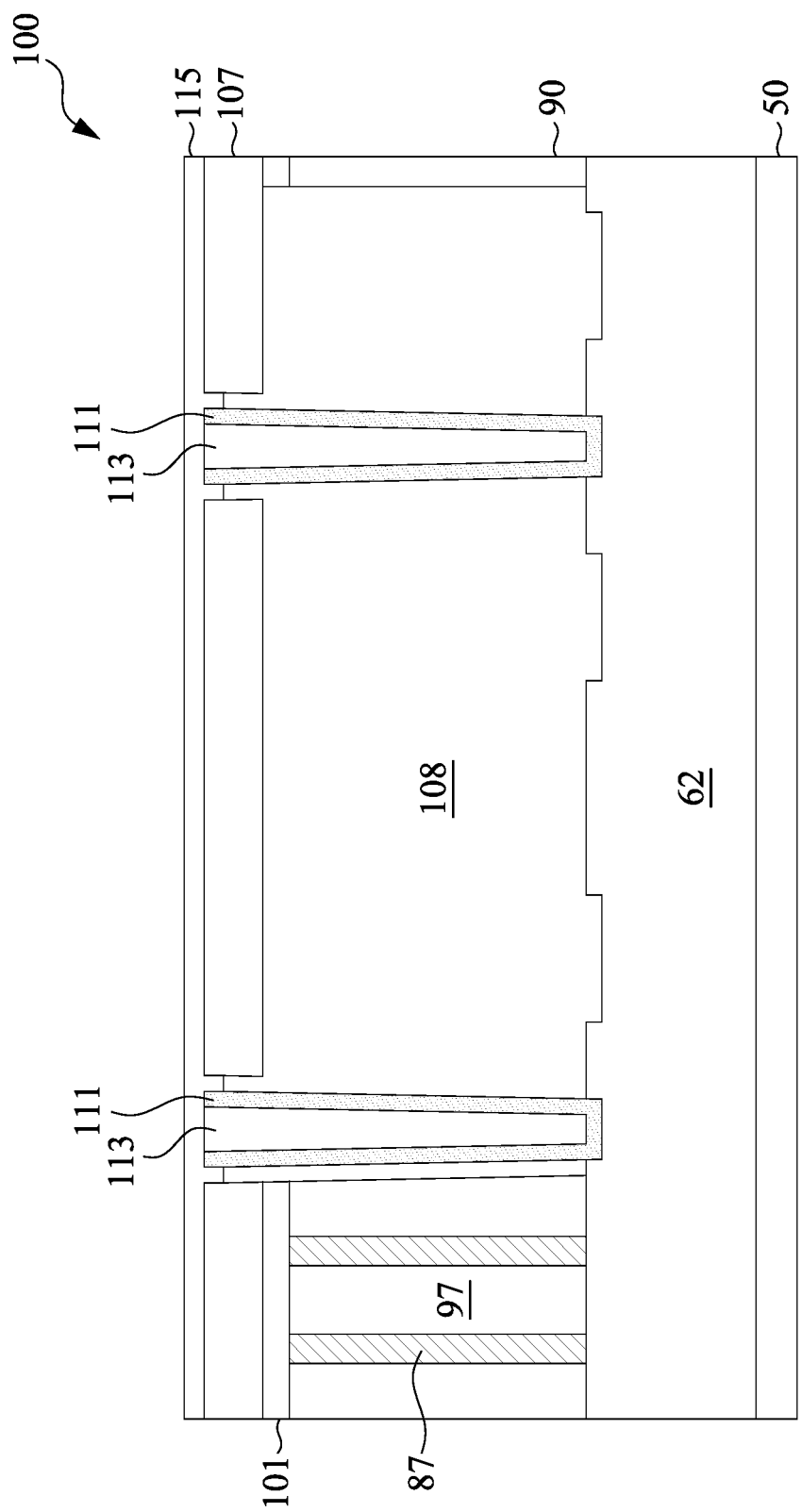
Figure 16B:
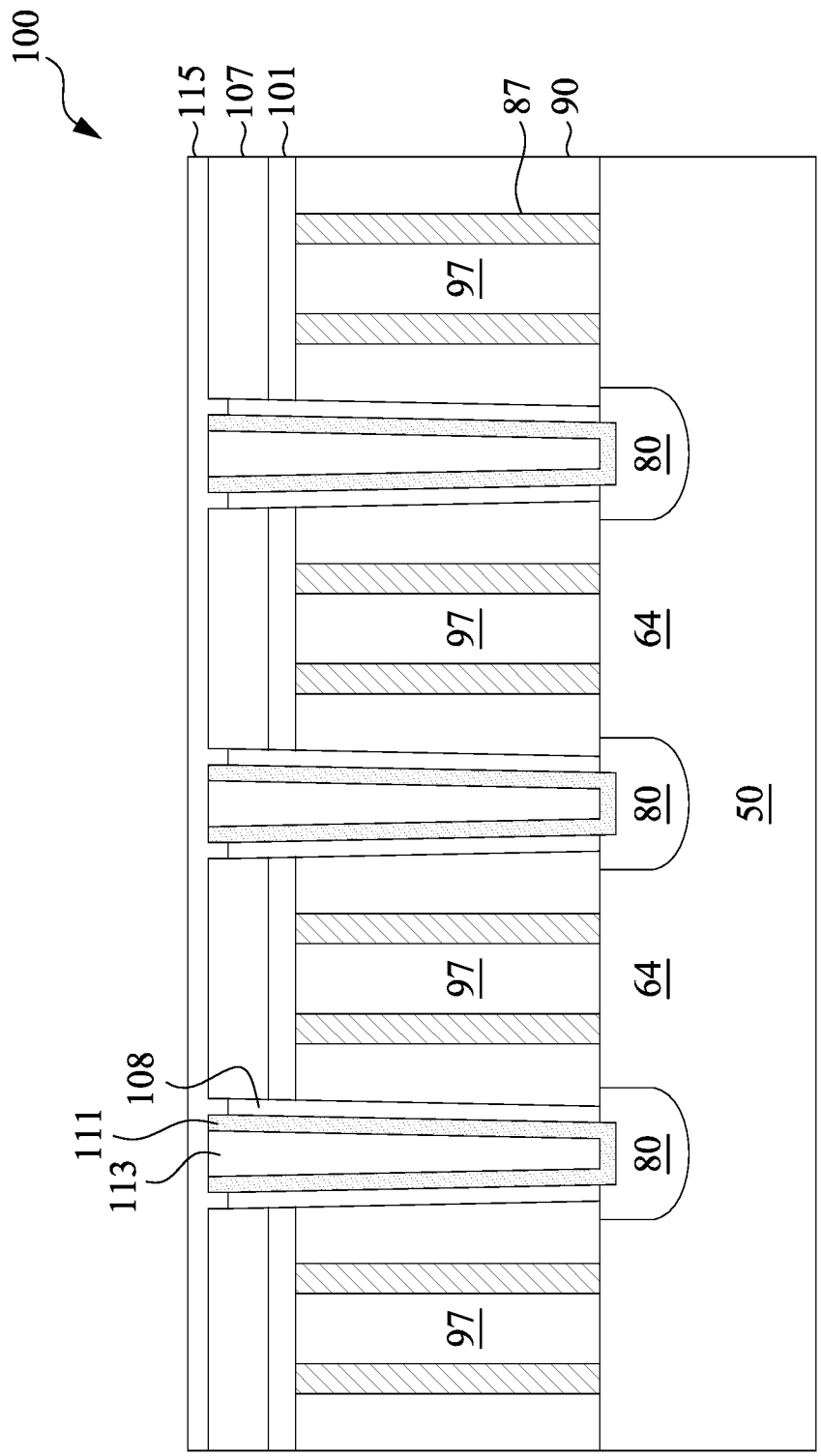
Figure 16D:
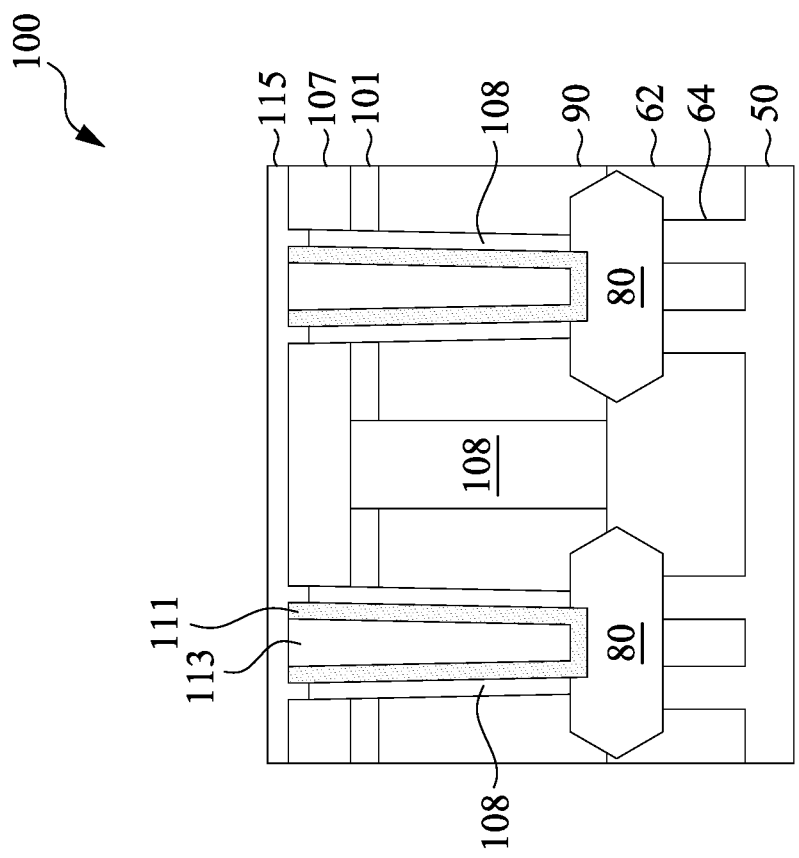
Figure 16C:
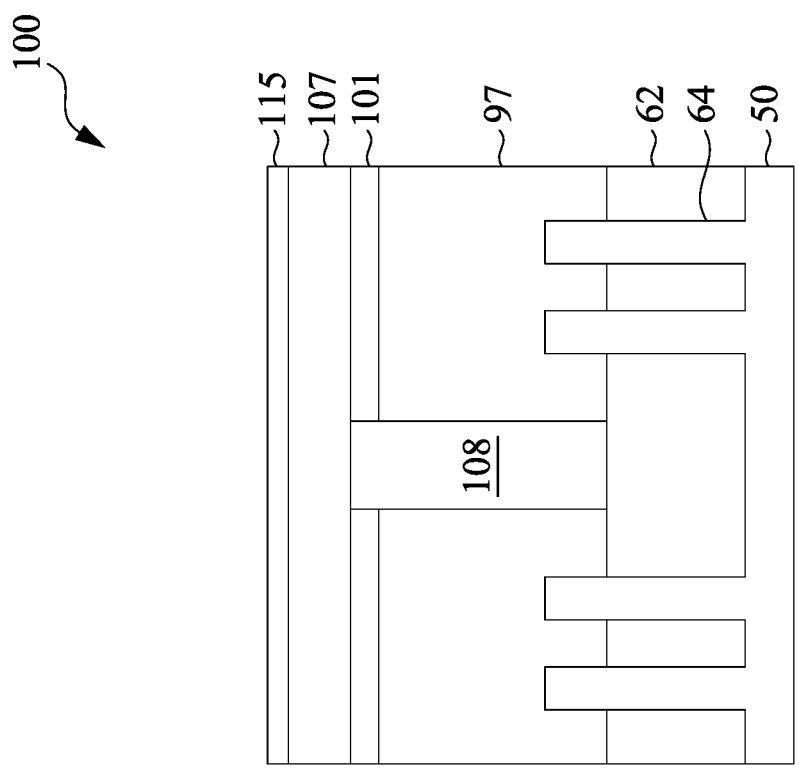

As illustrated in the top view of FIG. 8B, the openings 110 are formed along the longitudinal axis of the opening 104, and at least portions of the openings 110 overlap with the opening 104. Therefore, the openings 110 expose the sidewalls of the first dummy material 105, as illustrated in FIG. 13A. In the example of FIG. 13A, the opening 110A exposes a sidewall of the first ILD 90 on the left and exposes a sidewall of the first dummy material 105 on the right, and the opening 110B exposes sidewalls of the first dummy material 105 on both the left side and the right side. The openings 110 may further extend into the STI regions 62. As illustrated in FIGS. 8B and 13D, the openings 112 are formed over the source/drain regions 80, and may extend into the source/drain regions 80. In some embodiments, the openings 110 and 112 are formed in a same processing step, e.g., in a same photolithography and etching step using a same photomask.

Next, a second dummy material 109 (may also be referred to as a sacrificial material) is formed conformally over the second ILD 107, and along sidewalls and bottoms of the openings 110/112. The second dummy material 109 is formed of a same material as the first dummy material 105, in the illustrated embodiment. In some embodiments, the first dummy material 105 and the second dummy material 109 are formed of different materials, but have substantially the same etch rate (e.g., within 10% of each other) for a subsequent etching process to remove the first dummy material 105 and the second dummy material 109. Next, an anisotropic etching process is performed to remove portions of the second dummy material 109 disposed at the bottoms of the opening 110/112, such that the second dummy material 109 lines the sidewalls of the openings 110/112 but does not cover the bottoms of the openings 110/112.

As illustrated in FIG. 13A, the second dummy material 109 in the openings 110 (e.g., 100A, 100B) contacts and extends along sidewalls of the first dummy material 105. In a subsequent etching process (see FIG. 15A) to remove the first dummy material 105 and the second dummy material 109, the etchant removes the second dummy material 109 in the openings 110, then proceeds to remove the first dummy material 105 in the opening 104. In other words, the etchant is able to contact the first dummy material 105 through the opens 110. Details are discussed hereinafter.

Next, in FIGS. 14A-14D, a liner layer 111 is formed conformally in the openings 110/112, e.g., on the source/drain regions 80 at the bottoms of the openings 112, on the STI regions at the bottoms of the openings 110, and on the second dummy material 109 along the sidewalls of the openings 110/112. Although not illustrated, the liner layer 111 may also be formed over the upper surface of the second dummy material 109 extending along the upper surface of the second ILD 107. Next, a conductive material 113 is formed on the liner layer 111 to fill the openings 110/112. Next, a planarization process, such as CMP, is performed to remove portions of the second dummy material 109, portions of the liner layer 111, and portions of the conductive material 113 from the upper surface of the second ILD 107. After the planarization process, the upper surface of the second ILD 107 is exposed, the remaining portions of the conductive material 113 form contacts 113 (may also be referred to as contact plugs), and the liner layer 111 surrounds the contacts 113.

In some embodiments, the liner layer 111 is formed of a suitable conductive material, such as SiN, $SiO_2$, AlN, $Al_2O_3$, SiC, SiCN, or SiCON, using a suitable formation method such as PVD, CVD, ALD, or the like. The liner layer 111 separates the conductive material 113 from the second dummy material 109, and therefore, prevents the second dummy material 109 from being consumed by the conductive material 113 (e.g., through chemical reactions), in some embodiments. The conductive material 113 may be, e.g., Co, W, Cu, Al, Au, combinations thereof, or the like, and may be formed using CVD, PVD, ALD, plating, or the like. Note that in the discussion herein, unless otherwise specified, a conductive material refers to an electrically conductive material, and a conductive feature (e.g., a conductive line) refers to an electrically conductive feature.

In FIGS. 14A-14D, the contacts 113 formed in the openings 112 over the source/drain regions 80 are electrically coupled to the source/drain regions 80, and may be referred to as source/drain contacts. The contacts 113 formed in the openings 110 are electrically isolated (e.g., not electrically connected to a functional circuit), and may be referred to as dummy contacts.

Next, in FIGS. 15A-15D, the first dummy material 105 and the second dummy material 109 are removed, and air gaps 108 are formed at locations where the first dummy material 105 and the second dummy material 109 used to be. In some embodiments, a suitable etching process (e.g., a selective etching process), such as a dry etch, a wet etch, a reactive ion etch, or the like, using an etchant selective to (e.g., having a higher etching rate for) the material(s) of the first dummy material 105 and the second dummy material 109 is performed, such that the first dummy material 105 and the second dummy material 109 are removed without substantially attacking other layers or structures. For example, a dry etch process may be performed using an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), or an iodine-containing gas.

As illustrated in FIGS. 15A-15D, the air gaps 108 include portions of the trench 104 (see FIG. 11A) and portions of the openings 110/112. When viewed from the top (e.g., in a top view), each contact 113 is surrounded by an air gap 108. Therefore, the air gap 108 around each contact 113 may also be referred to as an air moat. Note that although the first dummy material 105 in the trench 104 is covered by the second ILD 107, the etchant of the etching process is able to reach (and remove) the first dummy material 105 through the air gaps 108 corresponding to the openings 110, as discussed earlier.

Next, in FIGS. 16A-16D, a dielectric layer 115 is formed over the second ILD 107 to seal the air gaps 108. The dielectric layer 115 may be a low-K dielectric material, such as SiCON, SiCO, SiC, or the like, and may be formed by CVD, PECVD, ALD, or the like. Portions of the dielectric layer 115 may protrude into the air gaps 108, thus sealing the air gaps 108. In other words, the air gaps 108 are sealed to form enclosed cavities.

In advanced processing nodes, as feature size continues to shrink and the integration density of transistors continues to increase, parasitic capacitance increases significantly, thus decreasing the performance of the device. The current disclosure, by forming air gaps 108 in the device, reduces the dielectric constant (e.g., the average dielectric constant) of the first ILD 90 and the second ILD 107, thereby reducing the parasitic capacitance of the device formed and improving the device performance. The disclosed method can be easily integrated into existing manufacturing flow. Improved device performance is achieved with little or no additional cost.

Additional processing may be performed to complete the fabrication of the FinFET device 100, as skilled artisans readily appreciate. For example, an interconnect structure, which includes a plurality of dielectric layers and conductive features (e.g., vias, conductive lines) formed in the plurality of dielectric layers, is formed over the dielectric layer 115. The interconnect structure electrically connects the underlying electrical components to form functional circuits. Details are not discussed here.

FIGS. 17-19 illustrate additional example FinFET devices (e.g., 100A, 100B, and 100C), in various embodiments. The FinFET devices 100A, 100B, and 100C are similar to the FinFET device 100, but the number, the location, the shape, and/or the dimension of the trench 104 are different from that of the FinFET device 100 in FIG. 8B.

In FIG. 17, two trenches 104A and 104B are formed in a FinFET device 100A along the longitudinal direction of the fins 64. Note that the trenches 104A and 104B do not overlap with the metal gate structure 97D, and therefore, the metal gate structure 97D is not cut by the cut-metal gate process.

In FIG. 18, two trench 104A and 104B are formed in a FinFET device 100B. The trench 104A has a first portion (e.g. the left portion) that is narrow than a second portion (e.g., the right portion) along the direction of cross-section B-B. The trench 104A overlaps with the metal gate structures 97A, 97B, and 97C. The trench 104B is spaced apart from the trench 104A, and has a same width as the second portion of the trench 104A along the direction of cross-section B-B. None of the trenches 104A and 104B overlaps with the metal gate structure 97D.

In FIG. 19, two trench 104A and 104B are formed in a FinFET device 100C. The trench 104A is narrower than the trench 104B along the direction of cross-section B-B. The trench 104A overlaps with the metal gate structures 97B and 97C. The trench 104B is disposed on an opposing side of the metal gate structures 97D from the trench 104A.

Embodiments may achieve advantages. For example, the present disclosure, by forming air gaps 108 in the device, reduces the parasitic capacitance of the device formed and improves the device performance. The disclosed method can be easily integrated into existing manufacturing flow. Improved device performance is achieved with little or no additional cost.

Figure 20:
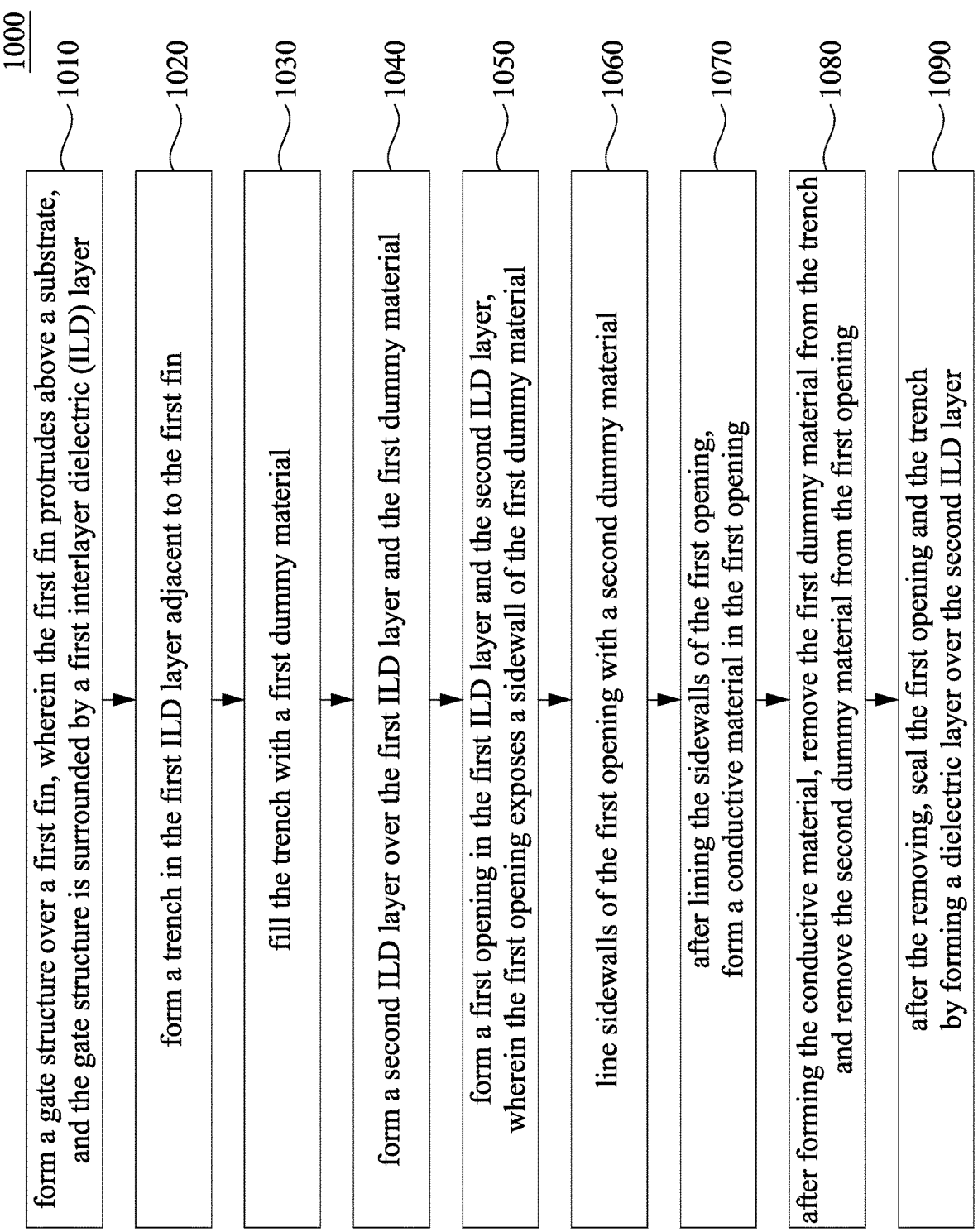
FIG. 20 illustrates a flow chart of a method of fabricating a semiconductor device, in accordance with some embodiments.

FIG. 20 illustrates a flow chart of a method of fabricating a semiconductor device, in accordance with some embodiments. It should be understood that the embodiment method shown in FIG. 20 is merely an example of many possible embodiment methods. One of ordinary skill in the art would recognize many variations, alternatives, and modifications. For example, various steps as illustrated in FIG. 20 may be added, removed, replaced, rearranged and repeated.

Referring to FIG. 20, at block 1010, a gate structure is formed over a first fin, wherein the first fin protrudes above a substrate, and the gate structure is surrounded by a first interlayer dielectric (ILD) layer. At block 1020, a trench is formed in the first ILD layer adjacent to the first fin. At block 1030, the trench is filled with a first dummy material. At block 1040, a second ILD layer is formed over the first ILD layer and the first dummy material. At block 1050, a first opening is formed in the first ILD layer and the second ILD layer, wherein the first opening exposes a sidewall of the first dummy material. At block 1060, sidewalls of the first opening are lined with a second dummy material. At block 1070, after lining the sidewalls of the first opening, a conductive material is formed in the first opening. At block 1080, after forming the conductive material, the first dummy material is removed from the trench and the second dummy material is removed from the first opening. At block 1090, after the removing, the first opening and the trench are sealed by forming a dielectric layer over the second ILD layer.

In an embodiment, a method of forming a semiconductor device includes: forming a gate structure over a first fin, wherein the first fin protrudes above a substrate, and the gate structure is surrounded by a first interlayer dielectric (ILD) layer; forming a trench in the first ILD layer adjacent to the first fin; filling the trench with a first dummy material; forming a second ILD layer over the first ILD layer and the first dummy material; forming a first opening in the first ILD layer and the second ILD layer, wherein the first opening exposes a sidewall of the first dummy material; lining sidewalls of the first opening with a second dummy material; after lining the sidewalls of the first opening, forming a conductive material in the first opening; after forming the conductive material, removing the first dummy material from the trench and removing the second dummy material from the first opening; and after the removing, sealing the first opening and the trench by forming a dielectric layer over the second ILD layer. In an embodiment, the first dummy material and the second dummy material are formed of a same material. In an embodiment, the first dummy material and the second dummy material are removed in a same etching process using an etchant selective to the first dummy material and the second dummy material. In an embodiment, forming the dielectric layer comprises forming the dielectric layer using a low-K dielectric material. In an embodiment, the method further includes, after the lining the sidewalls of the first opening and before forming the conductive material: conformally forming a liner layer in the first opening on the second dummy material, wherein the conductive material in the first opening is surrounded by the liner layer. In an embodiment, forming the trench comprises: forming an etch stop layer over the first ILD layer; forming a hard mask layer over the etch stop layer; forming an opening in the hard mask layer, wherein the opening exposes the etch stop layer; conformally forming a re-deposition layer over the hard mask layer and in the opening, wherein the re-deposition layer and the hard mask layer are formed of a same material; and performing a plurality of etching processes to remove a portion of the first ILD layer underlying the opening in the hard mask layer. In an embodiment, performing the plurality of etching processes comprises: performing a first dry etch process to remove the re-deposition layer; after the first dry etch process, performing a wet etch process to remove residues from the first dry etch process; and after the wet etch process, performing a second dry etch process, wherein the second dry etch process removes portions of the hard mask layer, the etch stop layer, and the first ILD layer. In an embodiment, a portion of the gate structure underlies the opening of the hard mask layer, wherein the second dry etch process removes the portion of the gate structure. In an embodiment, the gate structure is formed over a second fin parallel to the first fin, wherein the trench is formed between, and spaced apart from, the first fin and the second fin. In an embodiment, the method further includes: forming a second opening in the first ILD layer and the second ILD layer, wherein the second opening exposes an underlying source/drain region; lining sidewalls of the second opening with the second dummy material; after lining the sidewalls of the second opening, forming the conductive material in the second opening; after forming the conductive material, removing the second dummy material from the second opening; and after removing the second dummy material from the second opening, sealing the second opening by forming the dielectric layer over the second ILD layer. In an embodiment, the first opening and the second opening are formed in a same processing step. In an embodiment, the method further includes, before forming the conductive material, forming a conductive liner layer in the first opening and the second opening, wherein after being formed, the conductive material is surrounded by the conductive liner layer.

In an embodiment, a method of forming a semiconductor device includes: forming a gate structure over a first fin and over a second fin adjacent to the first fin, the gate structure being surrounded by a first interlayer dielectric (ILD) layer; forming a trench in the first ILD layer between the first fin and the second fin; filling the trench with a first dummy material; forming a second ILD layer over the first ILD layer and over the first dummy material; forming a first opening and a second opening in the first ILD layer and the second ILD layer, the first opening exposing the first dummy material, and the second opening exposing an underlying source/drain region; lining sidewalls of the first opening and sidewalls of the second opening with a second dummy material; after the lining, forming a conductive material in the first opening and in the second opening; after forming the conductive material, removing the first dummy material from the trench and removing the second dummy material from the first opening and the second opening; and after the removing, forming a dielectric layer over the second ILD layer to seal the trench, the first opening, and the second opening. In an embodiment, the first opening is formed between the first fin and the second fin, wherein in a top view, the first opening overlaps the trench. In an embodiment, the first dummy material and the second dummy material are formed of a same material. In an embodiment, the first dummy material and the second dummy material are removed by a same etching process. In an embodiment, a first bottom of the first opening and a second bottom of the second opening are free of the second dummy material, wherein the method further comprises, after the lining and before forming the conductive material: forming a conductive liner layer in the first opening and the second opening, wherein the conductive material is surrounded by the conductive liner layer.

In an embodiment, a semiconductor device includes: a fin protruding above a substrate; a gate structure over the fin; an interlayer dielectric (ILD) layer over the fin around the gate structure; a via extending through the ILD layer and electrically coupled to an underlying source/drain region; and an air gap around the via, wherein the via is spaced apart from the ILD layer by the air gap. In an embodiment, the semiconductor device further comprises a conductive liner layer around the via and under a bottom surface of the via facing the source/drain region. In an embodiment, in a top view, the air gap encircles the via, and is disposed on a first side of the gate structure overlapping at least a portion of the source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming a gate structure over a first fin, wherein the first fin protrudes above a substrate, and the gate structure is surrounded by a first interlayer dielectric (ILD) layer;
   forming a trench in the first ILD layer adjacent to the first fin;
   filling the trench with a first dummy material;
   forming a second ILD layer over the first ILD layer and the first dummy material;
   forming a first opening in the first ILD layer and the second ILD layer, wherein the first opening exposes a sidewall of the first dummy material;
   lining sidewalls of the first opening with a second dummy material;
   after lining the sidewalls of the first opening, forming a conductive material in the first opening;
   after forming the conductive material, removing the first dummy material from the trench and removing the second dummy material from the first opening; and
   after the removing, sealing the first opening and the trench by forming a dielectric layer over the second ILD layer.

2. The method of claim 1, wherein the first dummy material and the second dummy material are formed of a same material.

3. The method of claim 2, wherein the first dummy material and the second dummy material are removed in a same etching process using an etchant selective to the first dummy material and the second dummy material.

4. The method of claim 1, wherein forming the dielectric layer comprises forming the dielectric layer using a low-K dielectric material.

5. The method of claim 1, further comprising, after the lining the sidewalls of the first opening and before forming the conductive material:
   conformally forming a liner layer in the first opening on the second dummy material, wherein the conductive material in the first opening is surrounded by the liner layer.

6. The method of claim 1, wherein forming the trench comprises:
   forming an etch stop layer over the first ILD layer;
   forming a hard mask layer over the etch stop layer;
   forming an opening in the hard mask layer, wherein the opening exposes the etch stop layer;
   conformally forming a re-deposition layer over the hard mask layer and in the opening, wherein the re-deposition layer and the hard mask layer are formed of a same material; and
   performing a plurality of etching processes to remove a portion of the first ILD layer underlying the opening in the hard mask layer.

7. The method of claim 6, wherein performing the plurality of etching processes comprises:
   performing a first dry etch process to remove the re-deposition layer;
   after the first dry etch process, performing a wet etch process to remove residues from the first dry etch process; and
   after the wet etch process, performing a second dry etch process, wherein the second dry etch process removes portions of the hard mask layer, the etch stop layer, and the first ILD layer.

8. The method of claim 7, wherein a portion of the gate structure underlies the opening of the hard mask layer, wherein the second dry etch process removes the portion of the gate structure.

9. The method of claim 1, wherein the gate structure is formed over a second fin parallel to the first fin, wherein the trench is formed between, and spaced apart from, the first fin and the second fin.

10. The method of claim 1, further comprising:
    forming a second opening in the first ILD layer and the second ILD layer, wherein the second opening exposes an underlying source/drain region;
    lining sidewalls of the second opening with the second dummy material;

after lining the sidewalls of the second opening, forming the conductive material in the second opening;

after forming the conductive material, removing the second dummy material from the second opening; and after removing the second dummy material from the second opening, sealing the second opening by forming the dielectric layer over the second ILD layer.

11. The method of claim 10, wherein the first opening and the second opening are formed in a same processing step.

12. The method of claim 10, further comprising, before forming the conductive material, forming a conductive liner layer in the first opening and the second opening, wherein after being formed, the conductive material is surrounded by the conductive liner layer.

13. A method of forming a semiconductor device, the method comprising:

forming a gate structure over a first fin and over a second fin adjacent to the first fin, the gate structure being surrounded by a first interlayer dielectric (ILD) layer;

forming a trench in the first ILD layer between the first fin and the second fin;

filling the trench with a first dummy material;

forming a second ILD layer over the first ILD layer and over the first dummy material;

forming a first opening and a second opening in the first ILD layer and the second ILD layer, the first opening exposing the first dummy material, and the second opening exposing an underlying source/drain region;

lining sidewalls of the first opening and sidewalls of the second opening with a second dummy material;

after the lining, forming a conductive material in the first opening and in the second opening;

after forming the conductive material, removing the first dummy material from the trench and removing the second dummy material from the first opening and the second opening; and after the removing, forming a dielectric layer over the second ILD layer to seal the trench, the first opening, and the second opening.

14. The method of claim 13, wherein the first opening is formed between the first fin and the second fin, wherein in a top view, the first opening overlaps the trench.

15. The method of claim 13, wherein the first dummy material and the second dummy material are formed of a same material.

16. The method of claim 15, wherein the first dummy material and the second dummy material are removed by a same etching process.

17. The method of claim 13, wherein a first bottom of the first opening and a second bottom of the second opening are free of the second dummy material, wherein the method further comprises, after the lining and before forming the conductive material:

forming a conductive liner layer in the first opening and the second opening, wherein the conductive material is surrounded by the conductive liner layer.

18. A method of forming a semiconductor device, the method comprising:

forming a gate structure over a fin that protrudes above a substrate;

forming an interlayer dielectric (ILD) layer over the fin around the gate structure;

forming a trench in the ILD layer parallel to the fin;

filling the trench with a first dummy material;

forming an opening in the first dummy material;

lining sidewalls of the opening with a second dummy material;

after lining the sidewalls of the opening, forming a conductive material in the opening;

after forming the conductive material, removing the first dummy material from the trench and removing the second dummy material from the opening; and after the removing, sealing the opening and the trench by forming a dielectric layer over the ILD layer and over the conductive material.

19. The method of claim 18, wherein forming the trench comprises performing an etching processes to etch through the ILD layer using a mask layer having a mask opening, wherein a portion of the gate structure underlying the mask opening is removed by the etching process.

20. The method of claim 18, wherein the opening is formed at an end of the trench, wherein a first sidewall of the opening exposes the first dummy material, and a second opposing sidewall of the opening exposes the ILD layer.

* * * * *